(12) United States Patent
Heyd et al.

(10) Patent No.: US 10,001,819 B2
(45) Date of Patent: *Jun. 19, 2018

(54) DUAL-SIDED RACKMOUNT MODULAR DATA PROCESSING ASSEMBLY

(71) Applicant: Liqid Inc., Lafayette, CO (US)

(72) Inventors: Andrew Rudolph Heyd, Longmont, CO (US); Seth Walsh, Superior, CO (US); Brenden Michael Rust, Loveland, CO (US); Christopher R. Long, Colorado Springs, CO (US); Jason Breakstone, Broomfield, CO (US)

(73) Assignee: Liqid Inc., Broomfield, CO (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/586,608

(22) Filed: May 4, 2017

(65) Prior Publication Data
US 2017/0235347 A1    Aug. 17, 2017

Related U.S. Application Data

(63) Continuation of application No. 14/846,431, filed on Sep. 4, 2015, now Pat. No. 9,653,124.
(Continued)

(51) Int. Cl.
*H05K 5/00*    (2006.01)
*G06F 1/18*    (2006.01)
(Continued)

(52) U.S. Cl.
CPC .............. *G06F 1/185* (2013.01); *G06F 1/181* (2013.01); *G06F 1/187* (2013.01); *G06F 1/20* (2013.01);
(Continued)

(58) Field of Classification Search
CPC ....... G11B 33/128; G06F 1/185; G06F 1/181; G06F 1/187; G06F 1/20; H05K 7/1457; H05K 7/20136
(Continued)

(56) References Cited

U.S. PATENT DOCUMENTS 5,828,207 A    10/1998  Saadeh
6,061,750 A    5/2000   Beardsley et al.
(Continued)

OTHER PUBLICATIONS

Aragon, Juan L. et al., "Control Speculation for Energy-Efficient Next-Generation Superscalar Processors," IEEE Transactions on Computers, vol. 55, No. 3, pp. 281-291, Mar. 2006.
(Continued)

*Primary Examiner* — Nidhi Thaker

(57) ABSTRACT

Systems, methods, apparatuses, and assemblies for data storage systems are provided herein. In one example, a data processing assembly is presented. The data processing assembly includes a midplane assembly configured to electrically couple on a first side to storage modules, compute modules, or graphics modules, electrically couple on a second side to communication modules and one or more power supply modules. The data processing assembly includes a chassis configured to mechanically house and structurally support each of the storage modules, the compute modules, the communication modules, and the one or more power supply modules when coupled to the midplane assembly to form the data processing assembly and allow installation of the data processing assembly into a rackmount environment.

16 Claims, 21 Drawing Sheets

Related U.S. Application Data

(60) Provisional application No. 62/045,962, filed on Sep. 4, 2014.

(51) Int. Cl.

| | | |
|---|---|---|
| *H05K 7/14* | (2006.01) | |
| *G06F 1/20* | (2006.01) | |
| *H05K 7/20* | (2006.01) | |
| *G11B 33/12* | (2006.01) | |

(52) U.S. Cl.
CPC ......... *G11B 33/128* (2013.01); *H05K 7/1457* (2013.01); *H05K 7/20136* (2013.01)

(58) Field of Classification Search
USPC ........................................................ 361/724
See application file for complete search history.

(56) References Cited

U.S. PATENT DOCUMENTS

| | | | |
|---|---|---|---|
| 6,325,636 B1 | 12/2001 | Hipp et al. | |
| 7,243,145 B1 | 7/2007 | Poortman | |
| 7,260,487 B2 | 8/2007 | Brey et al. | |
| 7,505,889 B2 | 3/2009 | Salmonsen et al. | |
| 7,606,960 B2 | 10/2009 | Munguia | |
| 7,725,757 B2 | 5/2010 | Padweka et al. | |
| 8,045,328 B1* | 10/2011 | Chen | H05K 7/20727 165/121 |
| 8,125,919 B1 | 2/2012 | Khanka et al. | |
| 9,602,437 B1 | 3/2017 | Bernath | |
| 2002/0059428 A1 | 5/2002 | Susai et al. | |
| 2003/0110423 A1 | 6/2003 | Helms et al. | |
| 2003/0126478 A1 | 7/2003 | Burns et al. | |
| 2005/0223136 A1 | 10/2005 | Tanaka et al. | |
| 2005/0257232 A1* | 11/2005 | Hidaka | G11B 33/126 720/654 |
| 2006/0012950 A1* | 1/2006 | Shih | G06F 1/184 361/679.33 |
| 2006/0277206 A1 | 12/2006 | Bailey et al. | |
| 2008/0198744 A1 | 8/2008 | Menth | |
| 2009/0006837 A1 | 1/2009 | Rothman et al. | |
| 2009/0190427 A1 | 7/2009 | Brittain et al. | |
| 2009/0193201 A1 | 7/2009 | Brittain et al. | |
| 2009/0193203 A1 | 7/2009 | Brittain et al. | |
| 2010/0088467 A1 | 4/2010 | Lee et al. | |
| 2010/0271766 A1* | 10/2010 | Lin | G06F 1/184 361/679.02 |
| 2011/0194242 A1* | 8/2011 | Hu | G06F 1/187 361/679.32 |
| 2011/0289510 A1 | 11/2011 | Lin et al. | |
| 2011/0299317 A1 | 12/2011 | Shaeffer et al. | |
| 2011/0320861 A1 | 12/2011 | Bayer et al. | |
| 2012/0057317 A1* | 3/2012 | Lin | G06F 1/184 361/753 |
| 2012/0089854 A1 | 4/2012 | Breakstone et al. | |
| 2012/0151118 A1 | 6/2012 | Flynn et al. | |
| 2012/0166699 A1 | 6/2012 | Kumar et al. | |
| 2012/0210163 A1 | 8/2012 | Cho | |
| 2012/0317433 A1 | 12/2012 | Ellis et al. | |
| 2013/0077223 A1* | 3/2013 | Xu | G06F 1/20 361/679.4 |
| 2013/0132643 A1 | 5/2013 | Huang | |
| 2013/0185416 A1 | 7/2013 | Larkin et al. | |
| 2014/0047166 A1 | 2/2014 | Asnaashari et al. | |
| 2014/0103955 A1 | 4/2014 | Avritch et al. | |
| 2014/0108846 A1 | 4/2014 | Berke et al. | |
| 2014/0365714 A1 | 12/2014 | Sweere et al. | |
| 2015/0074322 A1 | 3/2015 | Galles | |
| 2015/0212755 A1 | 7/2015 | Asnaashari | |
| 2015/0304423 A1 | 10/2015 | Satoyama et al. | |

OTHER PUBLICATIONS

Lu, Yingping et al., "Performance Study of iSCSI-Based Storage Subsystems," IEEE Communications Magazine, pp. 76-82, Aug. 2003.

\* cited by examiner

DUAL-SIDED RACKMOUNT MODULAR DATA PROCESSING ASSEMBLY

RELATED APPLICATIONS

This application is a continuation of U.S. patent application Ser. No. 14/846,431, titled "DUAL-SIDED RACKMOUNT STORAGE ASSEMBLY," filed Sep. 4, 2015. This application also hereby claims the benefit of and priority to U.S. Provisional Patent Application 62/045,962, titled "RACKMOUNT STORAGE ASSEMBLY," filed Sep. 4, 2014, which is hereby incorporated by reference in its entirety.

BACKGROUND

Computer systems typically include bulk storage systems, such as magnetic disk drives, optical storage devices, tape drives, or solid state storage drives, among other storage systems. As storage needs have increased in these computer systems, networked storage systems have been introduced which store large amounts of data in a storage environment physically separate from end user computer devices. These networked storage systems typically provide access to bulk data storage over one or more network interfaces to end users or other external systems. In addition to storage of data, remote computing systems include various processing systems that can provide remote computing resources to end users. These networked storage systems and remote computing systems can be included in high-density installations, such as rack-mounted environments.

However, as the densities of networked storage systems and remote computing systems increase, various physical limitations can be reached. These limitations include density limitations based on the underlying storage technology, such as in the example of large arrays of rotating magnetic media storage systems. These limitations can also include computing density limitations based on the various physical space requirements for network interconnect as well as the large space requirements for environmental climate control systems.

In addition to physical space limitations, these bulk storage systems have been traditionally limited in the number of devices that can be included per host, which can be problematic in storage environments where higher capacity, redundancy, and reliability is desired. These shortcomings can be especially pronounced with the increasing data storage and retrieval needs in networked, cloud, and enterprise environments.

In rack-mounted environments, densities of associated computing and storage resources can also be limited by the mechanical restrictions of backplane-centric assemblies. Typically, one or more cooling or ventilation fans are employed in rack-mounted assemblies which are mounted in at the back or rear of the assemblies, often behind any associated backplane. This configuration prevents full use of the modular volume of a rack-mounted assembly, which limits the density of components therein and the efficiency of ventilation fans.

Overview

Systems, methods, apparatuses, and assemblies for data processing systems are provided herein. In one example, a data processing assembly is presented. The data assembly includes a midplane assembly configured to electrically couple on a first side to a plurality of storage modules, electrically couple on the first side to a plurality of compute modules, electrically couple on the first side to a plurality of graphics modules, electrically couple on a second side opposite the first side to a plurality of communication modules, electrically interconnect ones of the plurality of storage modules, the plurality of compute modules, the plurality of graphics modules, and the plurality of communication modules, and receive power from one or more power supply modules and distribute the power to the plurality of storage modules, the plurality of compute modules, the plurality of graphics modules, and the plurality of communication modules. The data processing assembly includes a chassis configured to mechanically house and structurally support each of the plurality of storage modules, the plurality of compute modules, the plurality of graphics modules, the plurality of communication modules, and the one or more power supply modules when coupled to the midplane assembly to form the data processing assembly and allow installation of the data processing assembly into a rackmount environment.

In another example, a modular data processing assembly is presented. The modular data processing assembly includes a plurality of front-side modules insertable into associated front-side bays of the modular data processing assembly that, when inserted, couple by associated electrical connectors to a front portion of a midplane assembly. The modular data processing assembly includes a plurality of rear-side modules insertable into associated rear-side bays of the modular data processing assembly that, when inserted, couple by associated electrical connectors to a rear portion of the midplane assembly. The modular data processing assembly includes the front portion of the midplane assembly and the rear portion of the midplane assembly spaced apart to provide volume for one or more fan modules inserted into the volume between the front portion of the midplane assembly and the rear portion of the midplane assembly.

In another example, a method of operating a modular data processing assembly is presented. The method includes housing in the modular data processing assembly one or more compute modules into front bays of the modular data processing assembly, housing in the modular data processing assembly one or more data storage octet modules into the front bays of the modular data processing assembly, and housing in the modular data processing assembly one or more communication modules into rear bays of the modular data processing assembly. The method also includes coupling electrical signaling associated with both the front bays through a front circuit board of a midplane assembly, coupling electrical signaling associated with both the rear bays through a rear circuit board of the midplane assembly, and coupling electrical signaling between the front circuit board and the rear circuit board of the midplane assembly using one or more cross-connect modules inserted into the rear bays that span the front circuit board and the rear circuit board. The method also includes providing a volume between the front circuit board and the rear circuit board of the midplane assembly into which one or more fan modules can be inserted to provide airflow to the modular data processing assembly through a plurality of apertures in the front circuit board and the rear circuit board of the midplane assembly.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

The various examples herein illustrate a storage assembly which includes various storage elements, processing elements, and communication elements. These various elements are included in modular assemblies which can be housed in an associated enclosure/chassis configuration. Additionally, a mid-mounted interconnect and ventilation system is employed as a "midplane" which advantageously allows for both front and rear mounted modular assemblies. Ventilation fans are also mounted in this midplane portion of the storage assembly, which allows for more efficient cooling of this high-density modular arrangement. In the examples below, the various modules and elements of various storage assemblies are shown.

Figure 1:
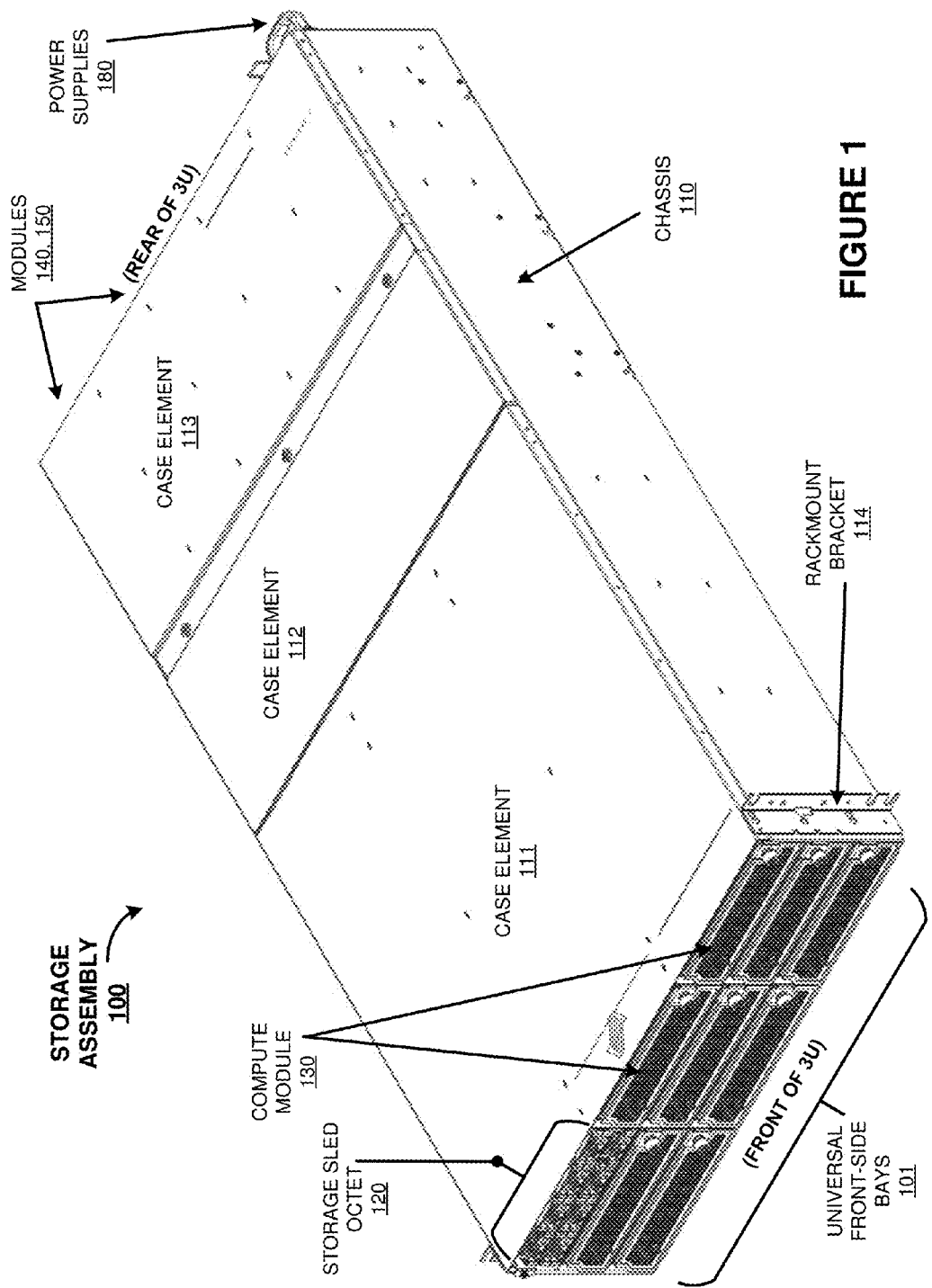
FIG. 1 is a diagram illustrating a storage assembly.
Figure 15:
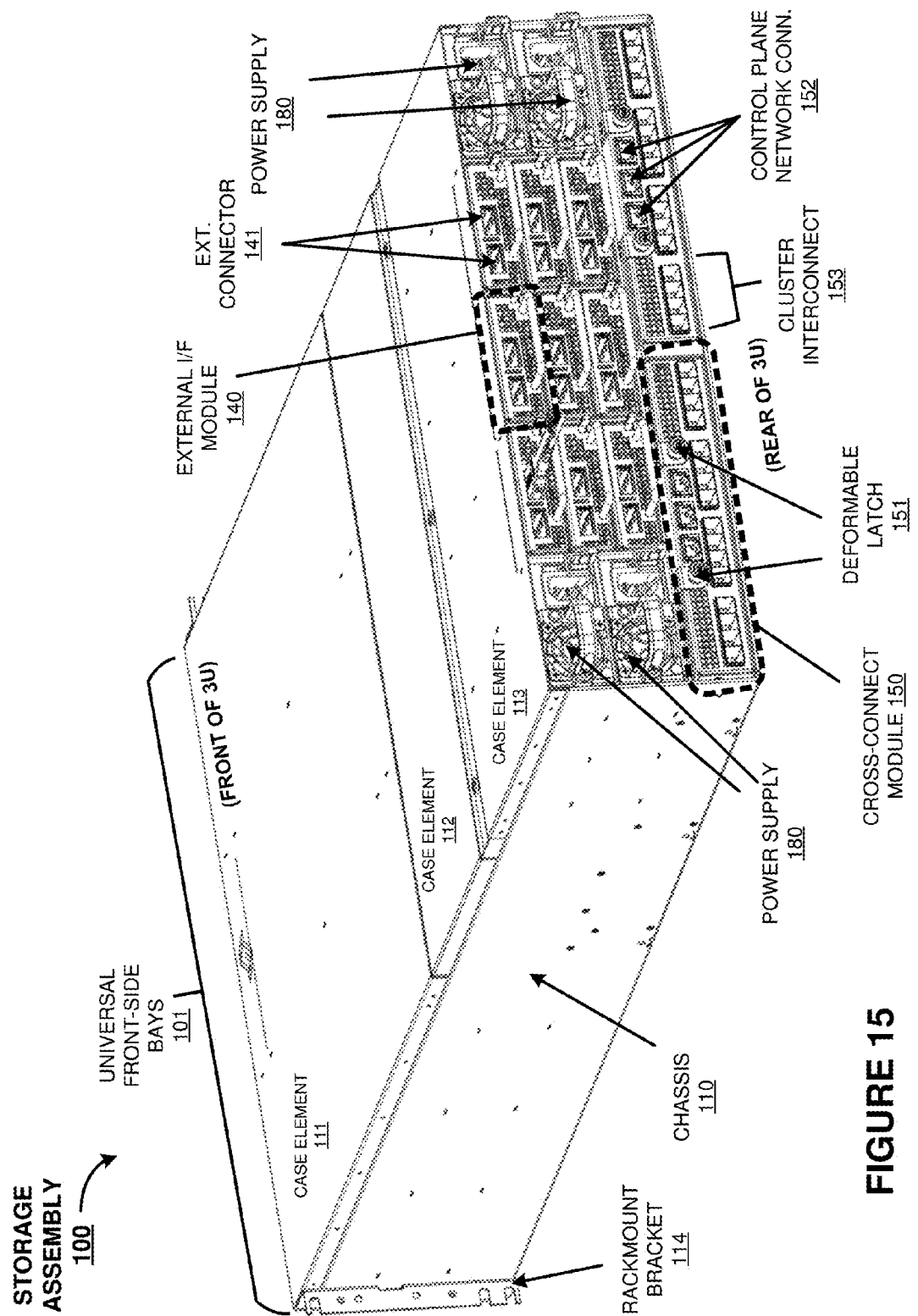
FIG. 15 is a diagram illustrating a storage assembly.

As a first example, FIG. 1 is provided. FIG. 1 is a diagram illustrating storage assembly 100, with an isometric view of a "front" side of storage assembly 100. An isometric "rear" view of storage assembly 100 is shown in FIG. 15. Storage assembly 100 comprises a plurality of different modular elements which can be employed for storage of digital data, processing of digital data, input/output (I/O) of various digital data, among other control features. In many examples, storage assembly 100 comprises a 3U-height rackmount assembly, although variations are possible.

Storage assembly 100 includes at least one chassis element 110 which provides a structure for various modules to interconnect and for mounting into a rack or shelf system. Chassis element 110 also provides a structure for various enclosure elements, such as case elements 111-113. The mechanical and structural elements of the chassis, casing, brackets, and mounts of storage assembly 100 and associated mechanical and structural elements can comprise machined, forged, cast, extruded, or other manufactured elements. These elements can be made of metals, metallic compounds, polymers, plastics, ceramics, or other materials, including combinations and variations thereof.

In one end of storage assembly 100, universal front-side bays 101 are employed, which in this example can hold any arrangement of up to nine total compute modules 130 or storage sled octets 120. Rear bays can hold various modules 140, 150, and 180, which are discussed in more detail in FIG. 15. Storage sleds 121 are inserted to form a storage array in octet physical arrangements, such as shown by storage sled octet 120. These compute modules 130 and storage sled octets 120 couple electrically and mechanically to various connectors and associated mechanical features that comprise a midplane that is located generally in the center of storage assembly 100, and covered by case element 112. Rear bays of storage assembly 100 can house external interfaces modules 140, cross-connect modules 150, and power supplies 180. Each of the modular elements of storage assembly 100 couple electrically and mechanically to various connectors and associated mechanical features of the midplane.

Each case element 111-113 in FIG. 1 forms an enclosure over the associated portion of assembly 100 and couples to fastening elements of chassis 110. Case element 111 covers the storage sleds and compute modules, case element 112 covers the midplane area and mid-mounted fans, and case element 113 covers the rear interconnect modules and power supplies. Rackmount bracket 114 is employed to secure assembly 100 into a rackmount assembly/shelf or rack environment. Various handles can be employed on each module to insert and remove the associated module, and various handles can be employed on chassis 110 to insert and remove assembly 100 from an associated rack.

Figure 2:
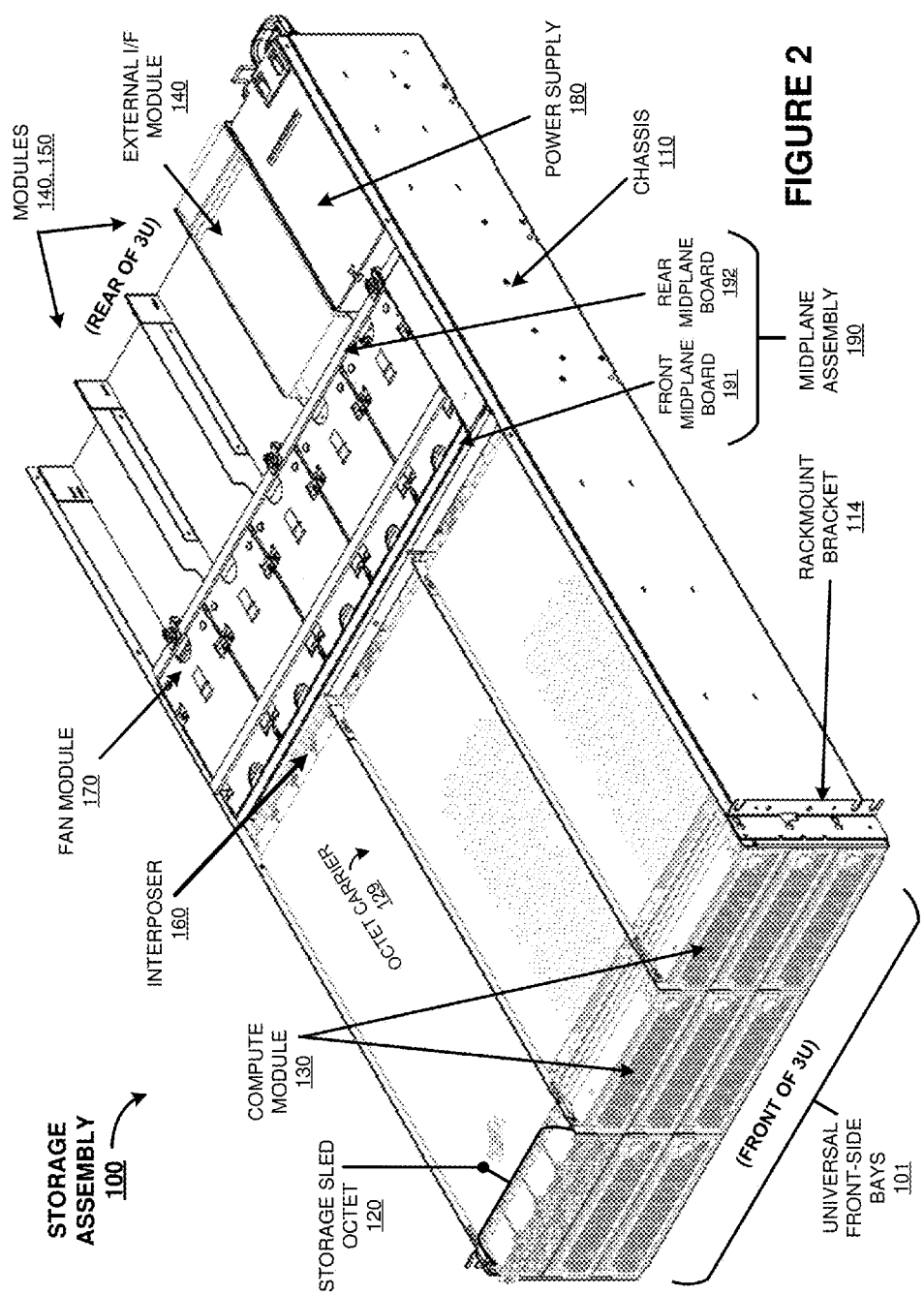
FIG. 2 is a diagram illustrating a storage assembly.

FIG. 2 shows storage assembly 100 with case elements 111-113 removed. Storage sled octets 120 and compute modules 130 are visible and fully populate the front end of storage assembly 100. One external interface module 140 and one power supply 180 populate the rear end of storage assembly 100, and a further view of the rear end is shown in FIG. 15. Each of the modules are inserted into assembly 100 and mated to midplane assembly 190. Midplane assembly 190 provides one or more circuit boards for electrically interconnecting the various modular elements of storage assembly 100. Midplane assembly 190 also includes various bays into which fans 170 can be inserted. Fans 170 provide forced air cooling for the elements of storage assembly 100. Various partitions or baffles can be employed between each fan employed, and each fan can have associated ducts or apertures for airflow through midplane assembly 190 to the various modules.

Figure 17:
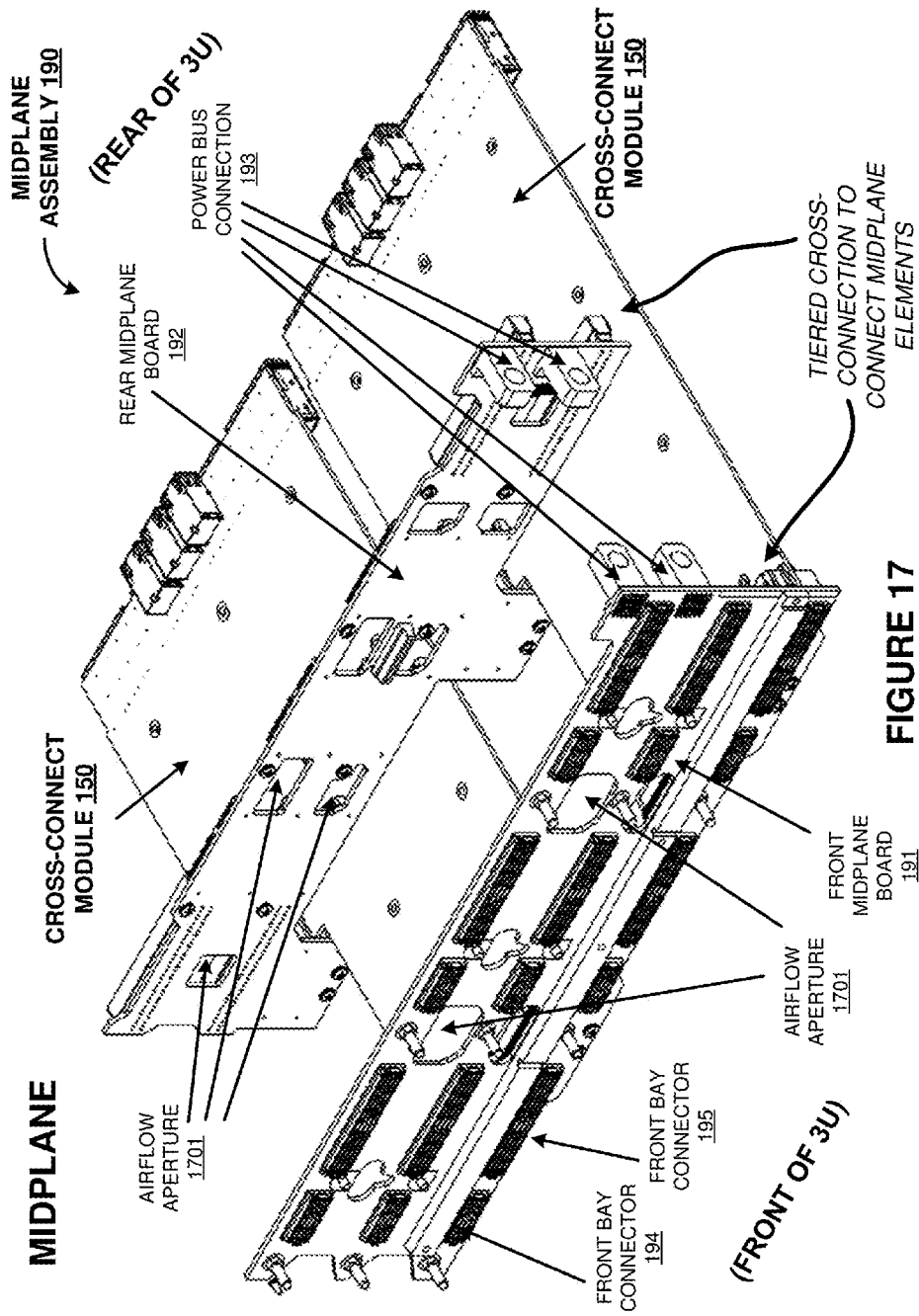
FIG. 17 is a diagram illustrating a midplane assembly.
Figure 18:
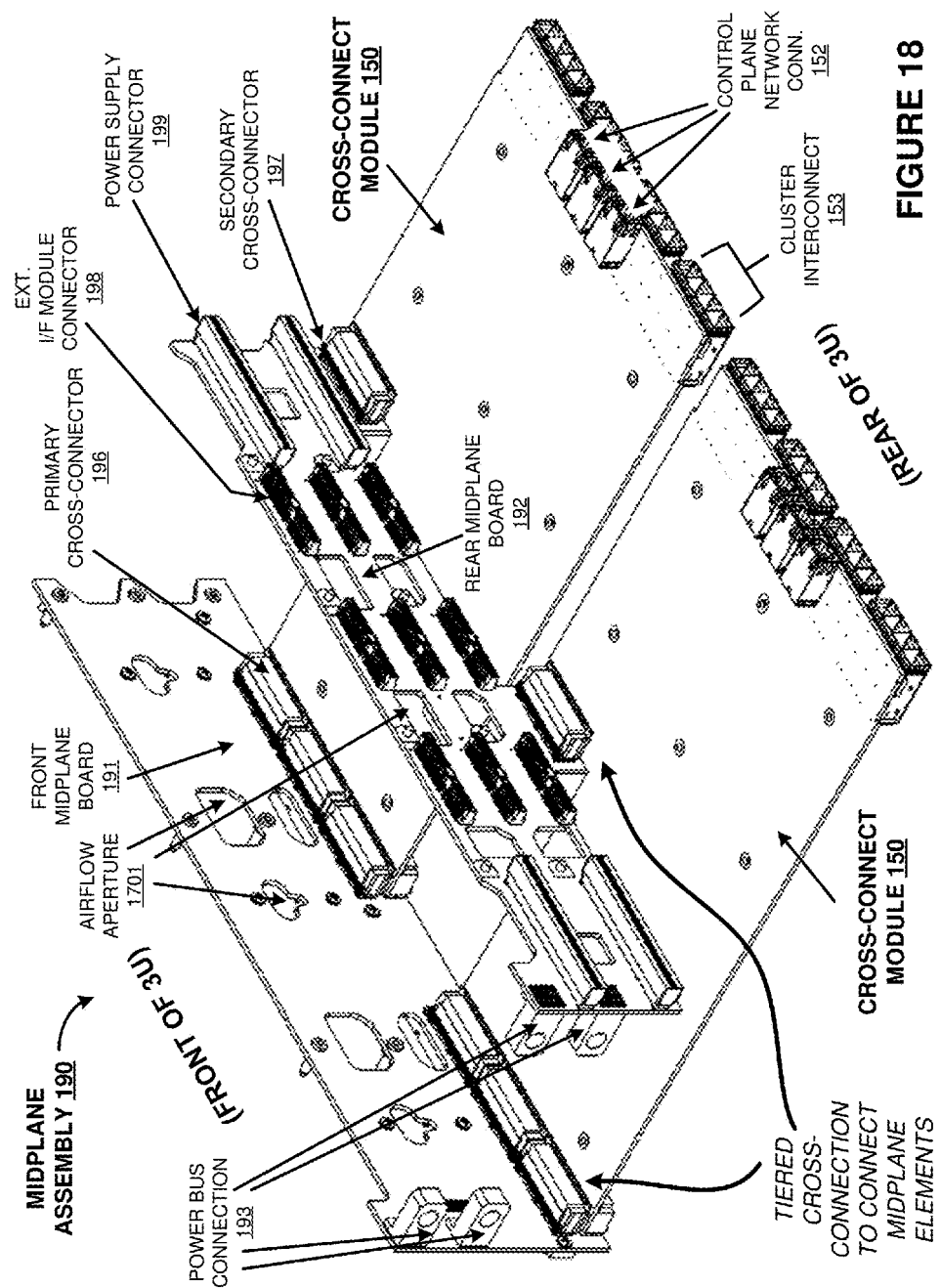
FIG. 18 is a diagram illustrating a midplane assembly.

Midplane assembly 190 includes two main boards, namely front midplane board 191 and rear midplane board 192. Front modules, such as those in front-side bays 101, plug into the front side of the front midplane board 191. Rear modules, such as modules 140, 150, and 180, plug into the rear side of rear midplane board 192. Fan modules 170 are positioned between front midplane board 191 and rear midplane board 192. In examples below, front midplane board 191 and rear midplane board 192 are spanned electrically and communicatively by one or more cross-connect modules 150. Front midplane board 191 and rear midplane board 192 form a "two-tier" connection for cross-connect modules 150, as seen in FIGS. 17 and 18. Cross-connect modules 150 can each span both front midplane board 191 and rear midplane board 192 to electrically couple front midplane board 191 and rear midplane board 192.

Also visible in FIG. 2 is interposer 160. Each storage sled octet 120 includes an interposer assembly to couple storage sleds 121 to front midplane board 191. Interposer 160 can include connectors and circuitry which allows for intercommunication of the storage sleds 121 with other modules, such as control and processing elements of storage assembly 100. Interposer 160 enables universal or common connectors to be employed for both the storage sled octet modules and the compute modules, which advantageously provide interchangeability among any of the universal front-side bays 101. This interchangeability allows a user to dynamically include variable numbers of storage sled octet modules and compute modules to tailor storage assembly 100 to processing performance or storage performance desires.

Figure 3:
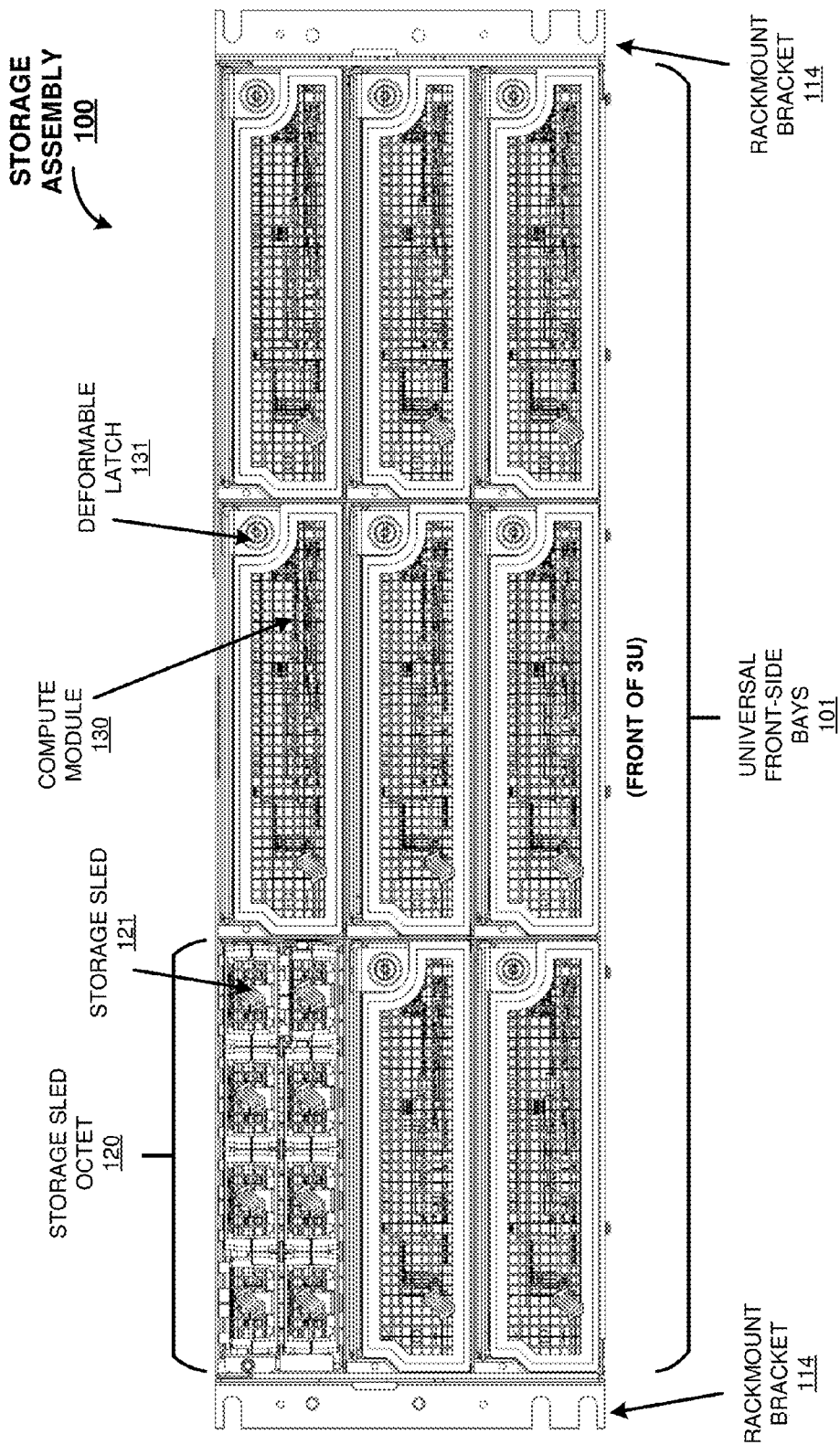
FIG. 3 is a diagram illustrating a storage assembly.

FIG. 3 shows an end view of storage assembly 100, namely a "front" view of storage assembly 100. In FIG. 3, one storage sled octet 120 and eight compute modules 130 are employed. These modules are inserted into ones of the universal front-side bays 101 of storage assembly 100. Other configuration of modules can be employed, such as seen in FIGS. 4-5.

Also visible in FIG. 3 is deformable latch 131, which is employed on each compute module 130. Deformable latch 131 is discussed in more detail in FIGS. 13-14 below. Deformable latch 131 provides for a large leverage force to be applied during insertion of compute module 131 into mating connectors of front midplane board 191. In the examples herein, two connectors are employed on each compute module 130 which mate to corresponding connectors on front midplane board 191. Deformable latch 131 also provides for a precision insertion of the compute modules into the connectors of the midplane which employ tight tolerances and short or small wipe connectors to minimize signal losses and signal integrity problems from connector-to-connector coupling.

Figure 4:
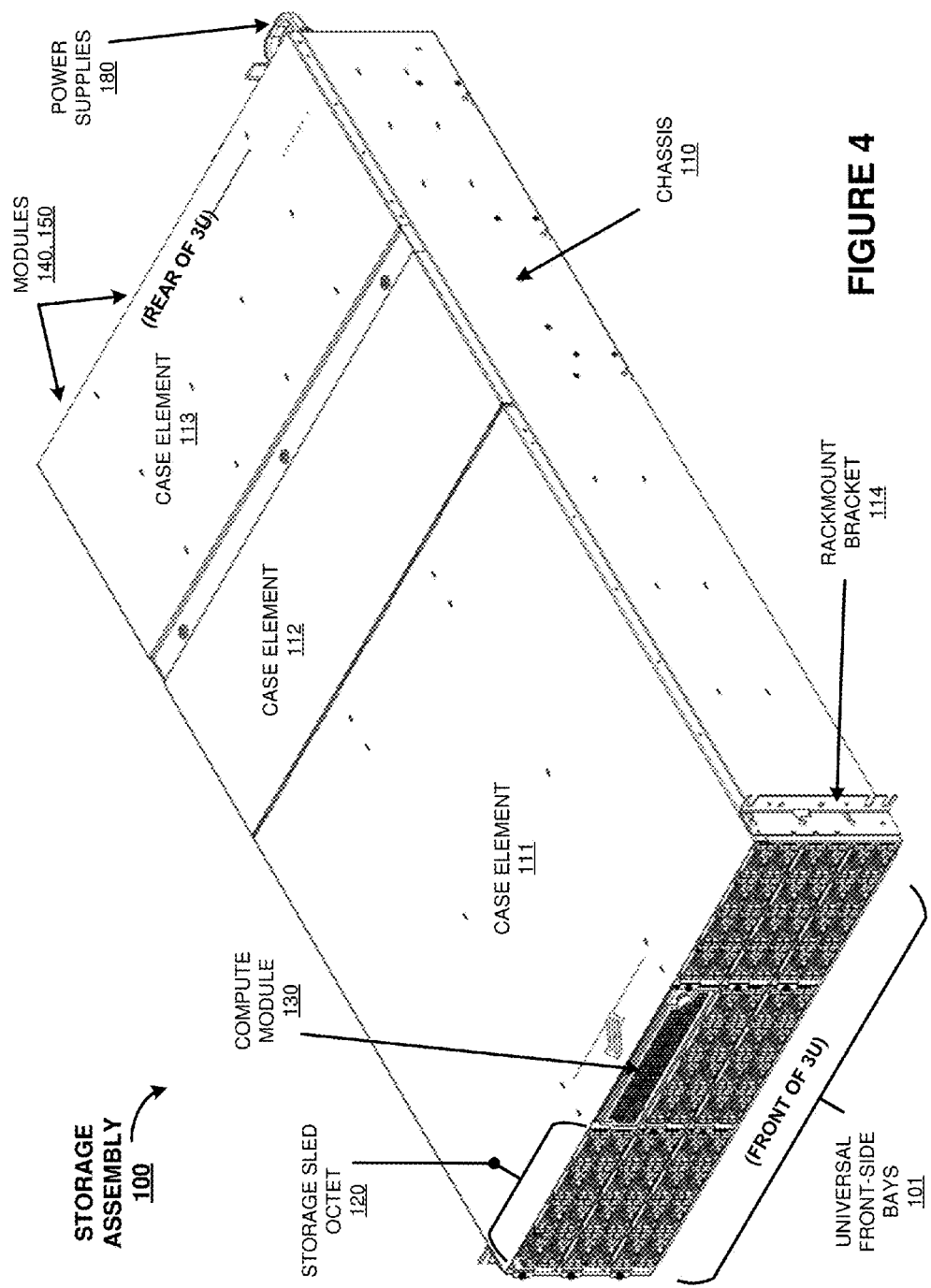
FIG. 4 is a diagram illustrating a storage assembly.
Figure 5:
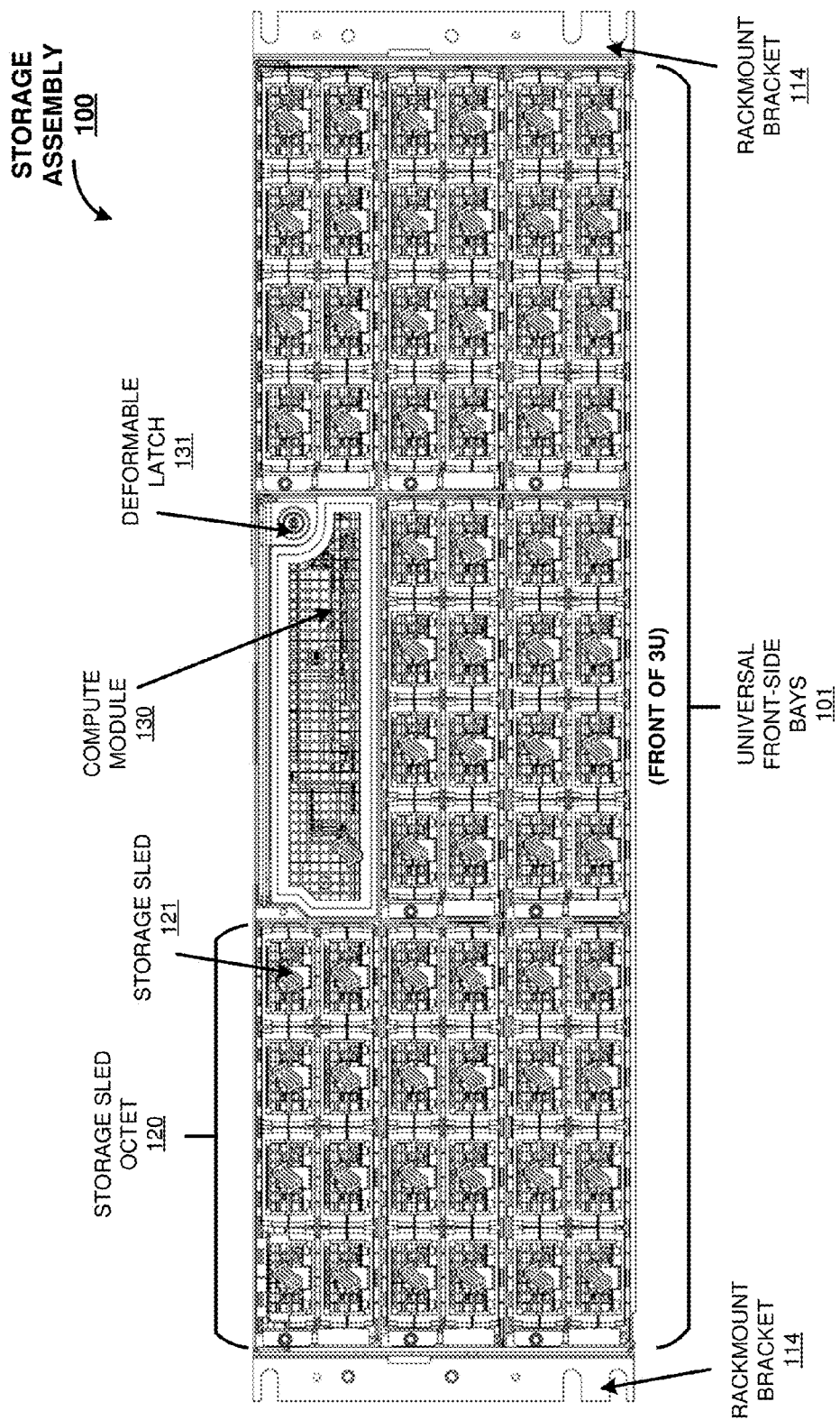
FIG. 5 is a diagram illustrating a storage assembly.

FIG. 4 is a diagram illustrating storage assembly 100, with an isometric view of a "front" side of storage assembly 100. FIG. 4 shows a different configuration of storage sled octets 120 and compute modules 130. FIGS. 1-3 show storage assembly 100 in a "compute centric" configuration which employs eight compute modules 130 and only one storage sled octet 120. Conversely, FIGS. 4-5 show storage assembly 100 in a "storage centric" confirmation which employs only one compute module 130 and eight storage sled octets 120.

The flexible configuration among compute modules and storage sled octets in storage assembly 100 is provided by the universal front-side bays 101. Each bay can accept any compute module and storage sled octet, and the nine bays can have any configuration of compute modules and storage sled octets. If more storage resources are desired, then more storage sled octets can be inserted into storage assembly 100, whereas if more processing resources are desired, then more compute modules can be inserted into storage assembly 100. Empty bays are possible, and hot-plugging of the various modules is also allowed. Balanced configurations, such as an equal mix of compute modules and storage sled octets, can also be achieved. In this manner, storage assembly 100 can be customized on-the-fly to adapt to storage or processing needs of a data center.

FIG. 5 shows an end view of storage assembly 100, namely a "front" view of storage assembly 100. In FIG. 5, eight storage sled octets 120 and one compute module 130 are employed. These modules are inserted into ones of the universal front-side bays 101 of storage assembly 100. Since each storage sled octet includes eight storage sleds 121, then 64 storage sleds 121 are included in the configuration illustrated in FIG. 5. As discussed below in FIG. 10, each storage sled 121 includes up to four solid state drives (SSDs). Thus, in the storage-centric configuration shown in FIG. 5, a total of 256 SSDs are employed (e.g. 4SSDs per storage sled, 8 storage sleds per octet, 8 octets installed). If 500 gigabyte (GB) SSDs are employed, then a total of 128 terabytes (TB) or storage can be provided by storage assembly 100 in a 3U modular configuration.

In the compute-centric configuration shown in FIGS. 1-3, 32 SSDs are employed (e.g. 4 SSDs per storage sled, 8 storage sleds per octet, 1 octet installed). Additionally, each compute module 130 includes two processing systems comprising central processing units (CPUs), which can comprise Intel, AMD, or ARM CPUs, among other varieties with any number of processing cores employed per CPU. The processing systems can comprise system-on-a-board or system-on-a-chip assemblies which comprise one or more CPUs, RAM (such as DRAM), and interfacing elements (such as PCIe interfaces, network interfaces, or other communication interfaces). These two processing systems can be seen in FIG. 12, although a different number of processing systems per compute module is possible. When 2 CPUs per compute module are included, then in the compute-centric configuration of FIGS. 1-3, sixteen CPUs are employed (e.g. 2 CPUs per compute module, 8 compute modules installed).

Figure 6:
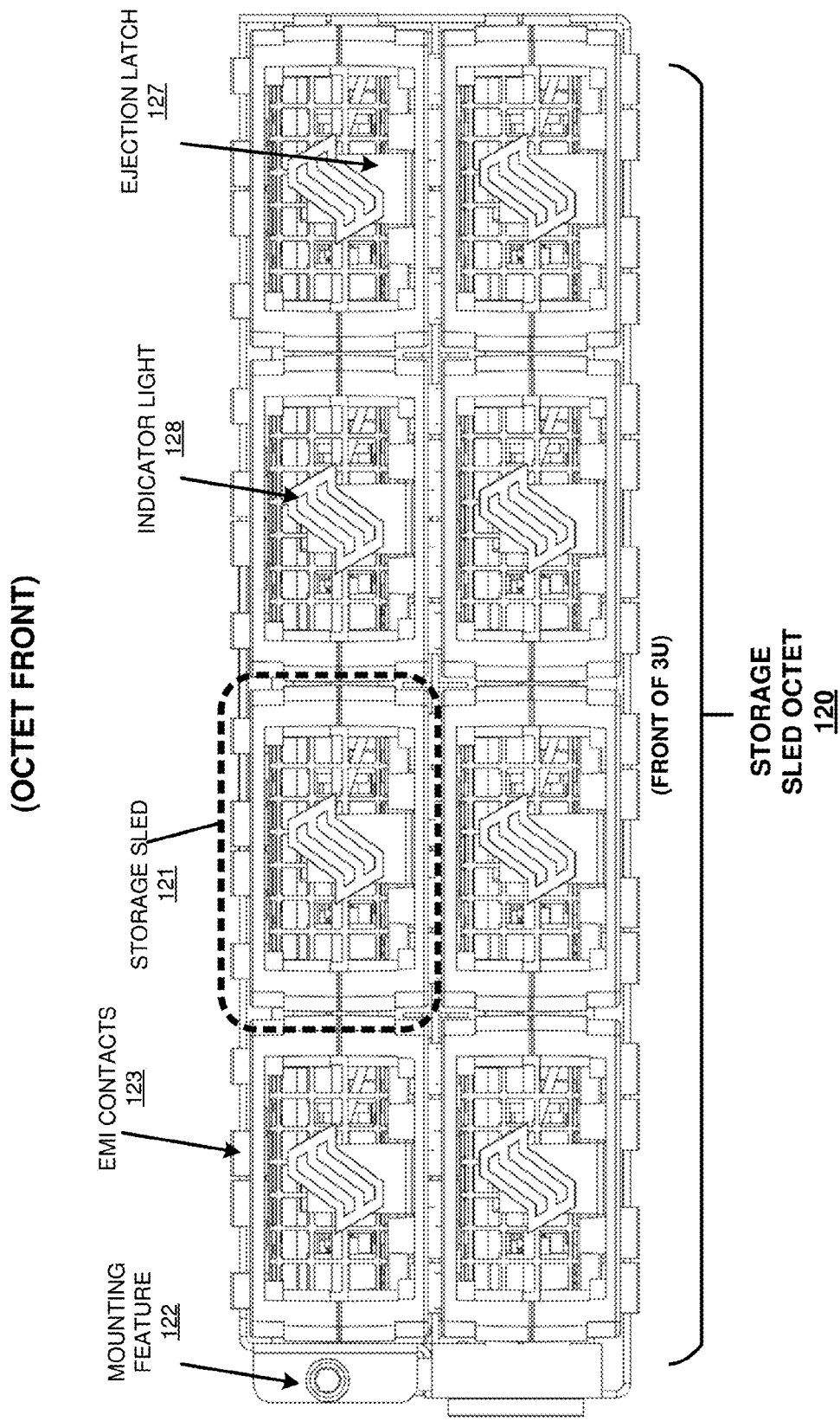
FIG. 6 is a diagram illustrating a storage octet assembly.

FIG. 6-10 illustrate various element of storage sled octet 120. In FIG. 6, a front view of storage sled octet 120 is shown. Eight storage sleds 121 are included in an octet, and each are insertable into individualized bays within a chassis of storage sled octet 120. Mounting feature 122 comprises a screw or other fastener for securing storage sled octet 120 into chassis 110 of storage assembly 100. In examples where mounting feature 122 comprises a screw, the turning of the screw provides insertion force to mate connectors of octet 120 into associated midplane connectors. Each sled 121 has an associated eject button 127 which allows for removal of an associated sled 121 from an octet assembly. Optional indicator light 128 can show status for an associated sled 121. For example, indicator light 128 can show storage activity of the associated storage drives. In other examples, indicator light 128 can indicate when removal is safe for a sled, such as when any in-transit data has been committed to non-volatile storage elements of the sled. Indicator light 128 can also show holdup power status for the sled, such as after a hot-removal of a sled or during power loss to system 100.

Electromagnetic interference (EMI) contacts 123 can be seen as protruding from each sled 121 and are configured to make contact with chassis 110 or with carrier 129 of the octet 120. In some examples, EMI contacts 123 electrically contact with conductive surfaces of carrier 129, while in other examples, EMI contacts 123 allow for electrical contact with conductive surfaces of the rackmount enclosure into which storage sled octet 120 is inserted. Combinations of configurations of EMI contacts 123 can be employed.

Figure 7:
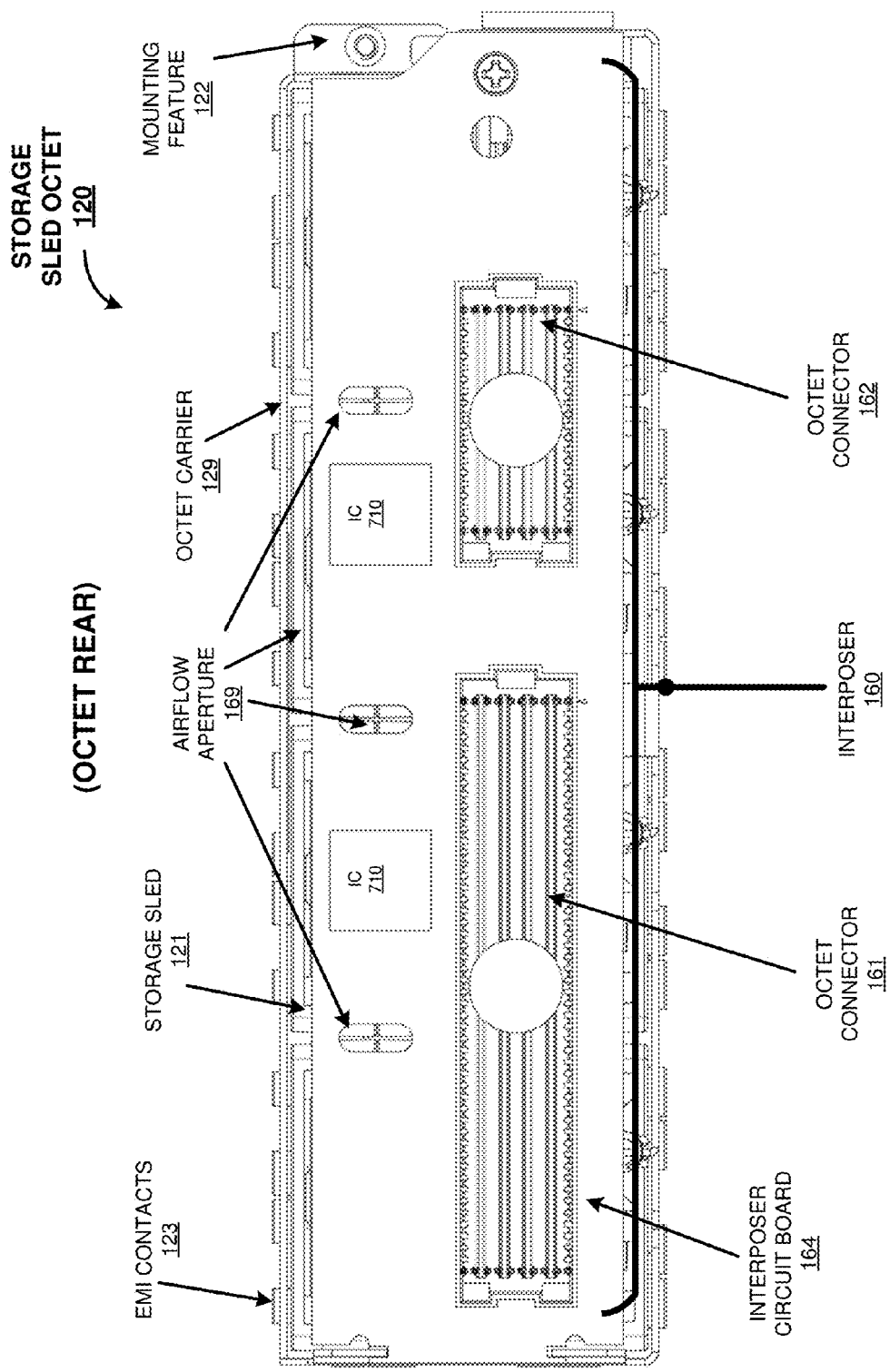
FIG. 7 is a diagram illustrating a storage octet assembly.

FIG. 7 shows a rear view of storage sled octet 120. In FIG. 7, octet connectors 161-162 are visible. Octet connectors 161-162 are included on a rear side of interposer 160. Octet connectors 161-162 are mounted on a rear side of interposer circuit board 164 to couple to associated connectors on a front side of midplane assembly 190, specifically front bay connectors 194-195 on front midplane board 191. Octet connectors 161-162 are high-density, short wipe electrical connectors that carry PCIe communications as well as various sideband and power signals. Each storage sled 121 of an octet can plug into an individual associated mating sled connector 163 on a front side of interposer circuit board 164 of interposer 160. Various airflow apertures 169 are shown to allow for airflow through interposer 160 and the associated octet 120 using an associated fan module 170. Some of airflow apertures 169 are formed by gaps at the top and bottom of interposer circuit board 164. FIG. 7 also shows integrated circuits 710 which can couple to electrical signals of storage sleds for assisting communications with storage sleds, sideband signaling, and other features discussed in FIG. 20.

Figure 8:
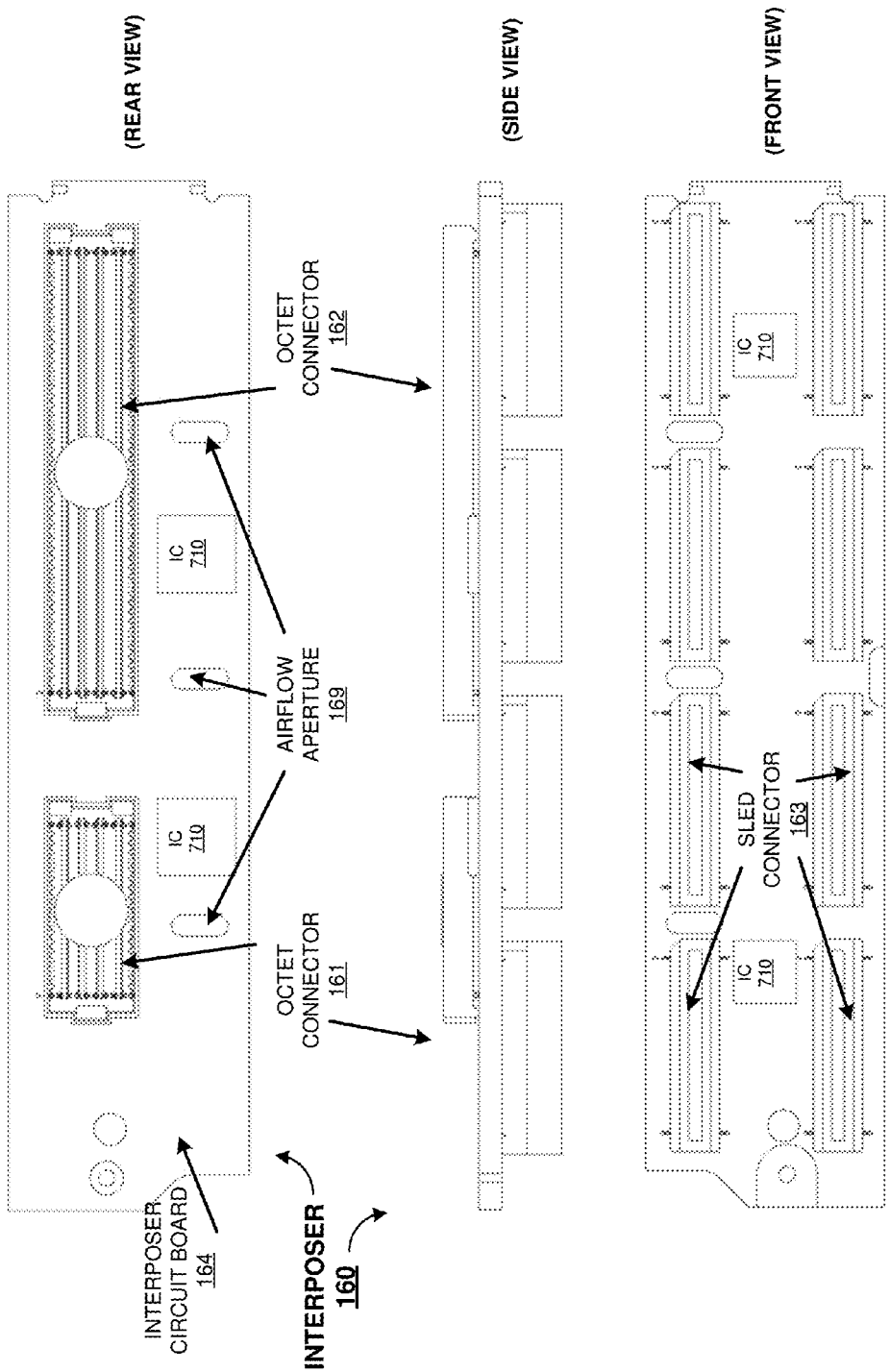
FIG. 8 is a diagram illustrating an interposer assembly.

FIG. 8 shows interposer 160 in three views, isolated from an octet assembly. Interposer 160 includes interposer circuit board 164 which mounts connectors 161-163. Connectors 161-162 both connect the entire octet 120 to midplane assembly 190, and sled connectors 163 each couple to individual sleds 121. In some examples, interposer circuit board 164 includes various circuitry to provide control and communication interconnection features to sleds 121 which are inserted into the octet.

Figure 9:
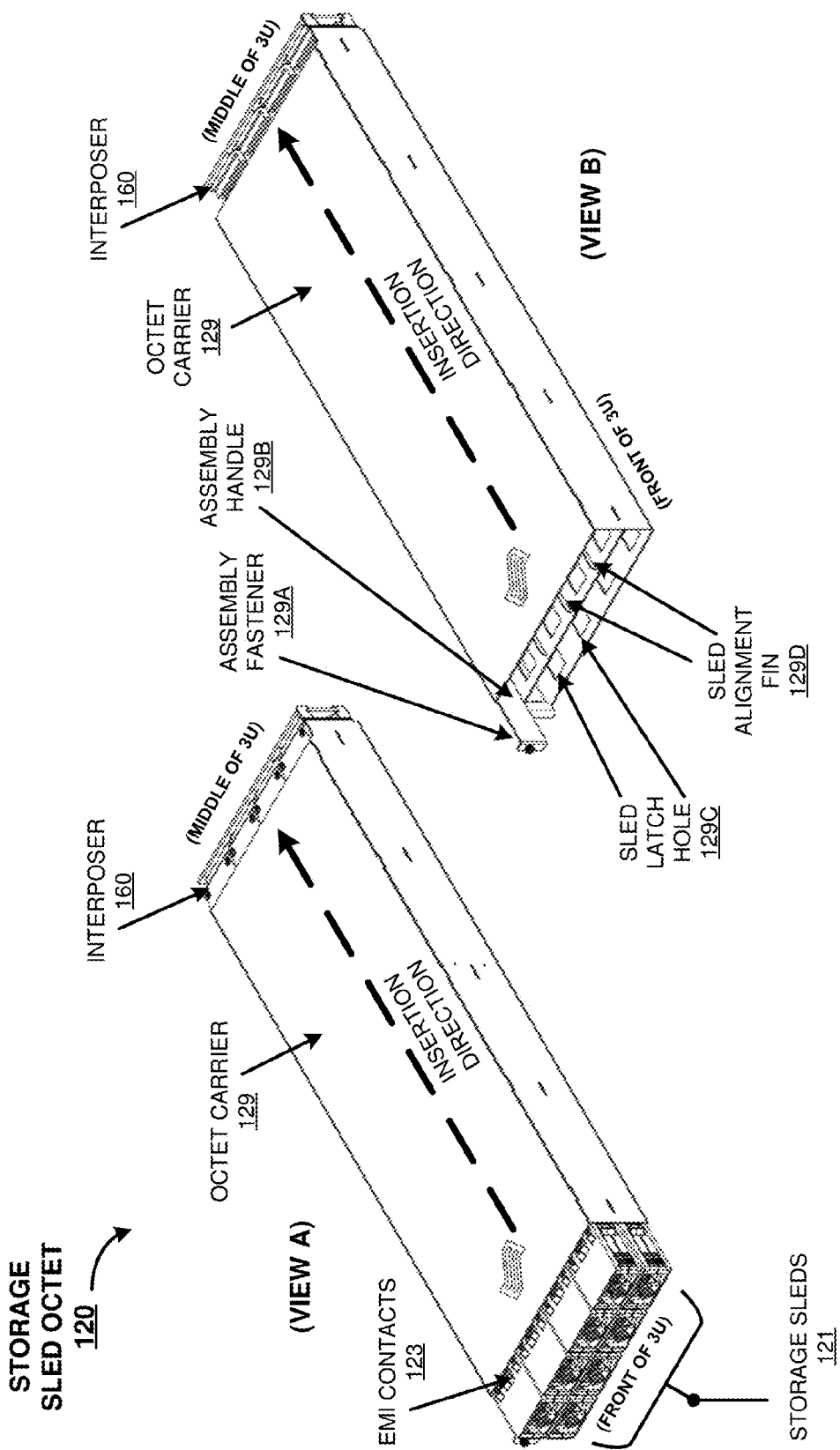
FIG. 9 is a diagram illustrating a storage octet assembly.

FIG. 9 illustrates storage sled octet 120 comprising octet carrier 129 into which storage sleds can be inserted into individually partitioned bays and structurally contained. FIG. 9 shows an eight-sled filled octet carrier 129 in "view A" and an empty octet carrier 129 in "view B." Storage sled octet 120 can hold up to eight storage sleds, such as storage sleds 121. The mechanical and structural elements of octet carrier 129 and associated mechanical and structural elements in FIG. 9 can comprise machined, forged, cast, extruded, or other manufactured elements. These elements can be made of metals, metallic compounds, polymers, plastics, ceramics, or other materials, including combinations and variations thereof.

Sled latch holes 129C can engage sled latches for the insertion and ejection processes discussed herein. Sled alignment fins 129D provide partitioned bays and channels for storage sleds to be inserted and inhibit side-to-side motion. Sled alignment fins 129D also ensure proper alignment of storage sleds during insertion to provide for proper mating of storage sled electrical connectors to connectors 163 associated with octet carrier 129. Storage sled octet 120 can be inserted into a bay of a further assembly or enclosure, such as a universal front-side bay 101 of a rackmount assembly or rackmount enclosure. Assembly handle 129B can provide for user insertion and removal of storage sled octet 120 in a bay of the rackmount enclosure, such as in a 3U enclosure. Assembly fastener 129A secures storage sled octet 120 into the rackmount enclosure, and can include screws, snap features, latches, or other fasteners.

Interposer 160 is shown as coupled to octet carrier 129. Interposer 160 can be fastened using one or more screws, rivets, or latching mechanisms to hold interposer 160 in relation to octet carrier 129. Each storage sled 121 can plug into an associated mating connector 163 on interposer 160, and connectors 161-162 on an opposite side of a circuit board 164 of interposer 160 can mate with connectors 194-195 on a midplane assembly.

Figure 10:
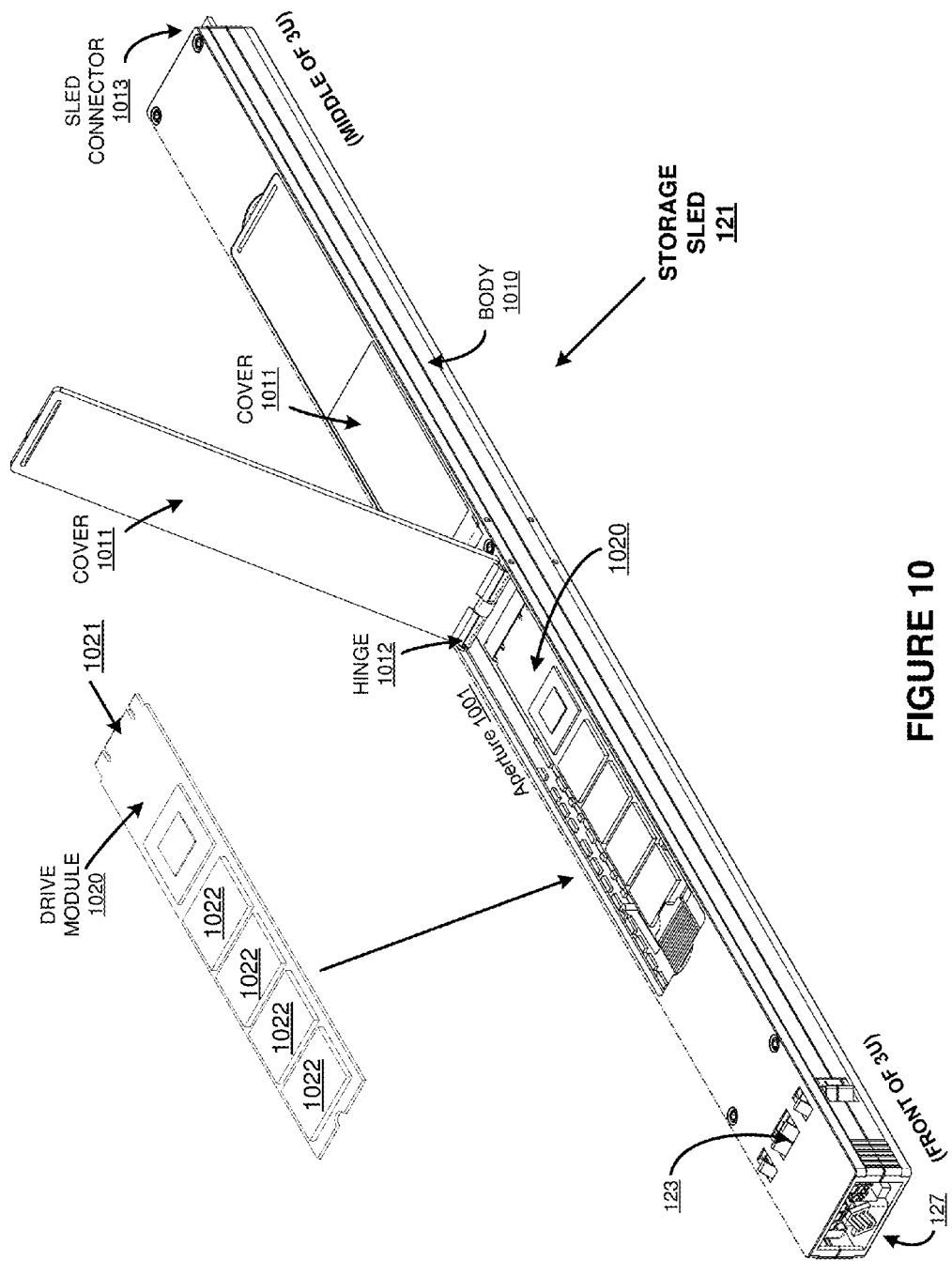
FIG. 10 is a diagram illustrating a storage sled assembly.

As an example of a data storage sled, FIG. 10 is presented. FIG. 10 is a diagram illustrating storage sled 121. Storage sled 121 includes various features and elements, and FIG. 10 illustrates at least storage sled body 1010, drive module covers 1011, cover hinges 1012, sled connector 1013, EMI contacts 123, and eject button 127. Additional features not labeled in FIG. 10 include body fasteners, cover closure features, lighted indicators, and side grip features. Although not shown in FIG. 10 for clarity and due to the selected view, storage sled 121 also includes two other covers and apertures for holding two additional drive modules 1020, for a total of four. The mechanical and structural elements of storage sled 121 and associated mechanical and structural elements in FIG. 10 can comprise machined, forged, cast, extruded, or other manufactured elements. These elements can be made of metals, metallic compounds, polymers, plastics, ceramics, or other materials, including combinations and variations thereof.

Storage sled 121 is configured to carry one or more drive modules, such as assembly drive module 1020 in FIG. 10, among other drive modules. In this example, up to four drive modules can be held by storage sled 121, with each drive module 1020 covered by an associated cover 1011 after being inserted into storage sled 121. Each of covers 1011 can be opened by a user or operator using associated cover closure features. Each of covers 1011 can be hinged at hinge 1012 which allow a user to rotate the associated cover outward from sled 121 to gain access to an aperture 1001 in which a drive module is inserted and removed. In some examples, hinge 1012 is spring-loaded and upon pressing a latch or friction-fit feature of a closure, hinge 1012 allows cover 1011 to open outward. When spring-loaded, hinge 1012 can provide resistance to closure by a user and a latch or mating features of a cover closure to keep cover 1011 closed and flush with body 1010.

Storage sled body 1010 is composed of at least two shell portions, namely a top body and a bottom body. The at least two body portions enclose a printed circuit board, sled insertion elements, and drive module mounting elements, and are secured together with fasteners, such as screws, rivets, clips, welds, and the like. Storage sled body 1010 is configured to be slid into associated mating features of a larger enclosure or storage assembly, such as an octet assembly, which can hold many storage sleds, as featured in FIGS. 9 above.

Latch features are included on the bottom of sled 121 and are configured to engage with associated latch mates with an associated sled latch hole 129C of FIG. 9 within an octet assembly to provide purchase of storage sled 121 within the associated alignment fins 129D as well as provide resistance to removal of storage sled 121 from the associated mounting features in the assembly. Eject button 127 is coupled to the latch features to allow for ejection and removal of storage sled 121 from the octet assembly. Side grip features allow for a human operator to grip storage sled 121 for insertion and removal from an associated assembly. Once slid into associated mounting rails, guides, or features of the larger assembly, sled connector 1013 is configured to electrically and mechanically mate with an associated external connector, such as connector 163 on interposer printed circuit board (PCB) 164, or alternatively a midplane or backplane PCB of the assembly. Each sled connector 1013 carries PCIe communications as well as various sideband and power signals. Insertion of storage sled 121 in an incorrect orientation is prevented by a mating feature, such as a pin or protrusion, in the storage assembly, or alternatively by a unidirectional or keyed version of connector 1013.

Additionally, FIG. 10 shows EMI contacts 123. EMI contacts 123 are configured to electrically mate with storage sled body 1010. EMI contacts 123 can each be composed of metallic or conductive materials. When storage sled body 1010 is composed of non-conductive materials, then a metallic layer, such as a coating or foil, can line inner or outer surfaces of storage sled body 1010 to provide shielding, which electrically contacts EMI contacts 116. In some examples, EMI contacts 123 are formed from the same piece of conductive material, such as a stamped metal part that is folded and welded or soldered together to form EMI contacts 123. In other examples, EMI contacts 123 are formed from a machined metallic part or formed from separate pieces and electrically bonded together. EMI contacts 123 comprise one or more metallic fingers or springs which electrically contact both body 1010 and an associated assembly into which storage sled 121 is inserted or into a rack-mounted assembly into which the storage assembly is inserted. Thus, body 1010 forms a Faraday cage around electrical components of storage sled 121 and EMI contacts 123 are configured to touch external conductive surfaces and hold contact with the surfaces using a spring force formed by EMI contacts 123 extending outward from sled 121.

Drive module 1020 includes solid state memory chips 1022, and edge connector 1021. In some examples, the solid state storage elements of drive module 1020 include memory chips, such as chips 1022 which can comprise flash memory, magnetic random access memory, phase change memory, memristors, or other solid state memory devices. Drive module 1020 can comprise different form factors of drive modules. Drive module 1020 can include other components and elements, such as mounting holes, processors, interface chips, passive components, holdup circuitry, among other components and elements. In some examples, drive module 1020 comprises a M.2 solid state drive (SSD) module, which can have a variable dimensions, such as width and length, based on model, manufacturer, storage capacity, or embedded features, among other factors. Other examples include MiniPCI express cards, mini-serial ATA (mSATA) cards, and the like, with varying dimensions. Adjustable mount features allow for varying lengths of M.2 SSD modules, such as lengths of 16, 26, 30, 38, 42, 60, 80 and 110 millimeters (mm), among others. Advantageously, commodity or off-the-shelf M.2 SSD modules (or other drive modules) can be deployed in storage sled 121 using the adjustable mounting features.

Removal of drive module 1020 from storage sled 121 is as follows. Cover 1011, flush with body 1010 when closed, is opened using a fingernail or small item that engages a cover closure. Cover 1011 is opened by a user, or by a spring associated with hinge 1012 to expose drive module 1020 in aperture 1001. Drive module 1020 can then be removed from associated connector and from sled 121. Advantageously, sled 121 allows for tool-less insertion and removal.

To eject storage sled 121 from a storage assembly, eject button 127 is able to be pushed by an operator, and consequently move an eject lever which can engage a latch spring. Movement of eject button 127 is opposed by a spring force provided by the latch spring and associated fasteners to body 1010. The ejection process allows storage sled 121 to slide within an assembly into which sled 121 was previously inserted. An ejection spring, previously compressed by an insertion process, provides ejection force for sled 121 to move outward from a mating connector of the storage assembly and the storage assembly itself.

In further examples, a lighted ejection or insertion indicator 128 (as seen in FIG. 6) can be coupled to eject button 127. This indicator may be customized to appear as a logo or other shape or size. Various transparent or translucent features can allow light to be emitted from the indicator, such as glass, acrylic, or other polymer. In some examples, a light, such as a light emitting diode, can be included in the indicator which can indicate various properties of sled 121. These properties can include insertion or ejection status, such as lit when properly inserted and unlit when ejected. These properties can include other functional properties, such as an operational status of elements of sled 121. Light pipes, comprising a fiber optic element or polymer light guide, can be employed to carry light from an internal indicator circuit to the indicator. In examples where a light is mounted into the indicator, one or more wires or signal links can be employed and routed to eject button 127. An associated indicator circuit can be communicatively coupled to processing elements of sled 121.

Figure 11:
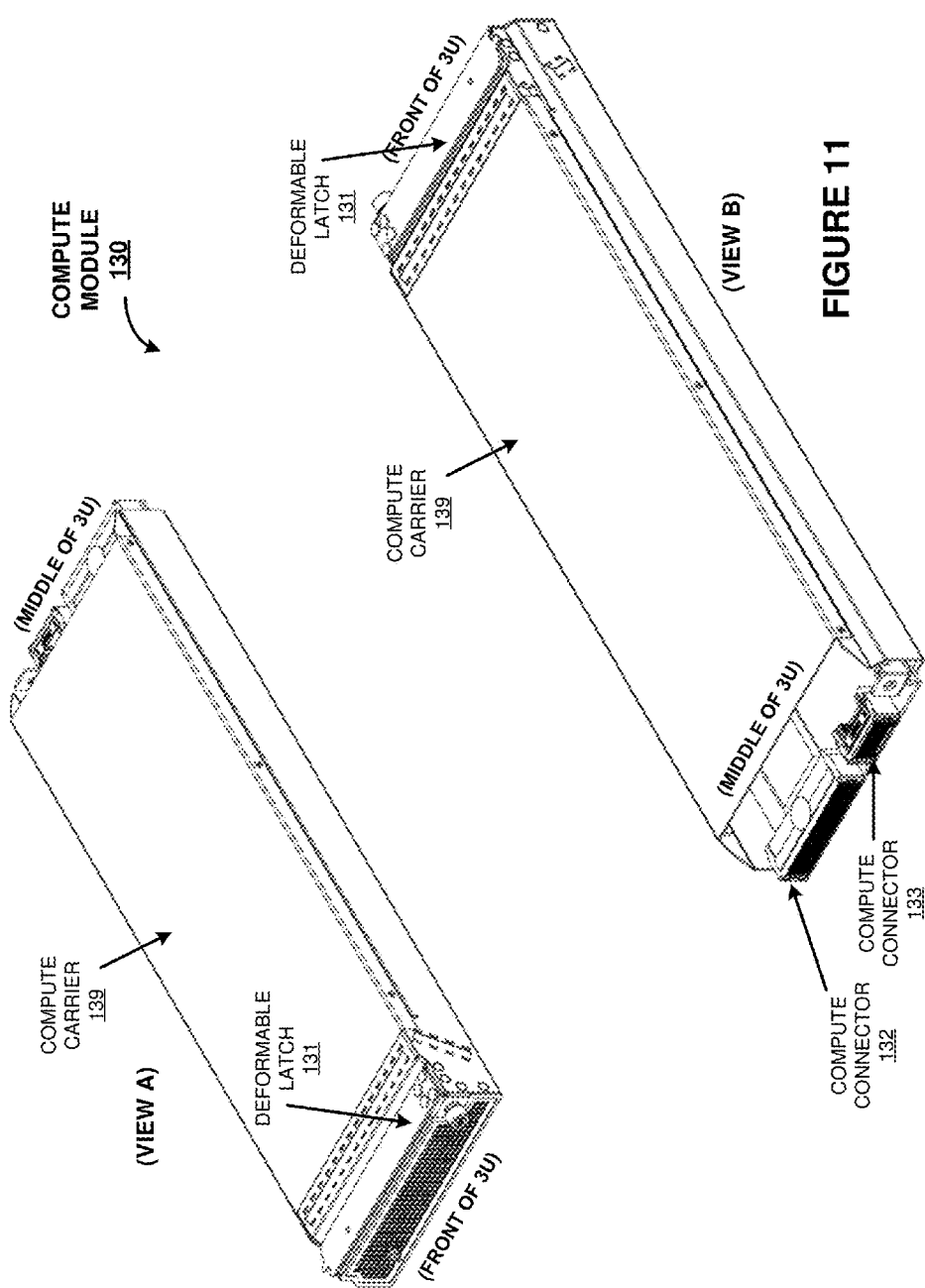
FIG. 11 is a diagram illustrating a compute module assembly.

FIG. 11 shows a detailed diagram of two views of compute module 130. View 'A' focuses on a front side of compute module 130, while view 'B' focuses on a rear side of compute module 130. Compute module 130 has connectors 132-133 for coupling to midplane assembly 190, specifically to front bay connectors 194-195. Connectors 132-133 can carry PCIe communications as well as various sideband and power signals. Compute module 130 also includes deformable latch 131 for an operator to insert and remove compute module 130 from a storage assembly. Compute module 130 includes carrier 139 for carrying the various components of compute module 130. Compute module 130 also includes various casing and enclosure elements to cover the various electrical and mechanical elements of compute module 130.

Figure 12:
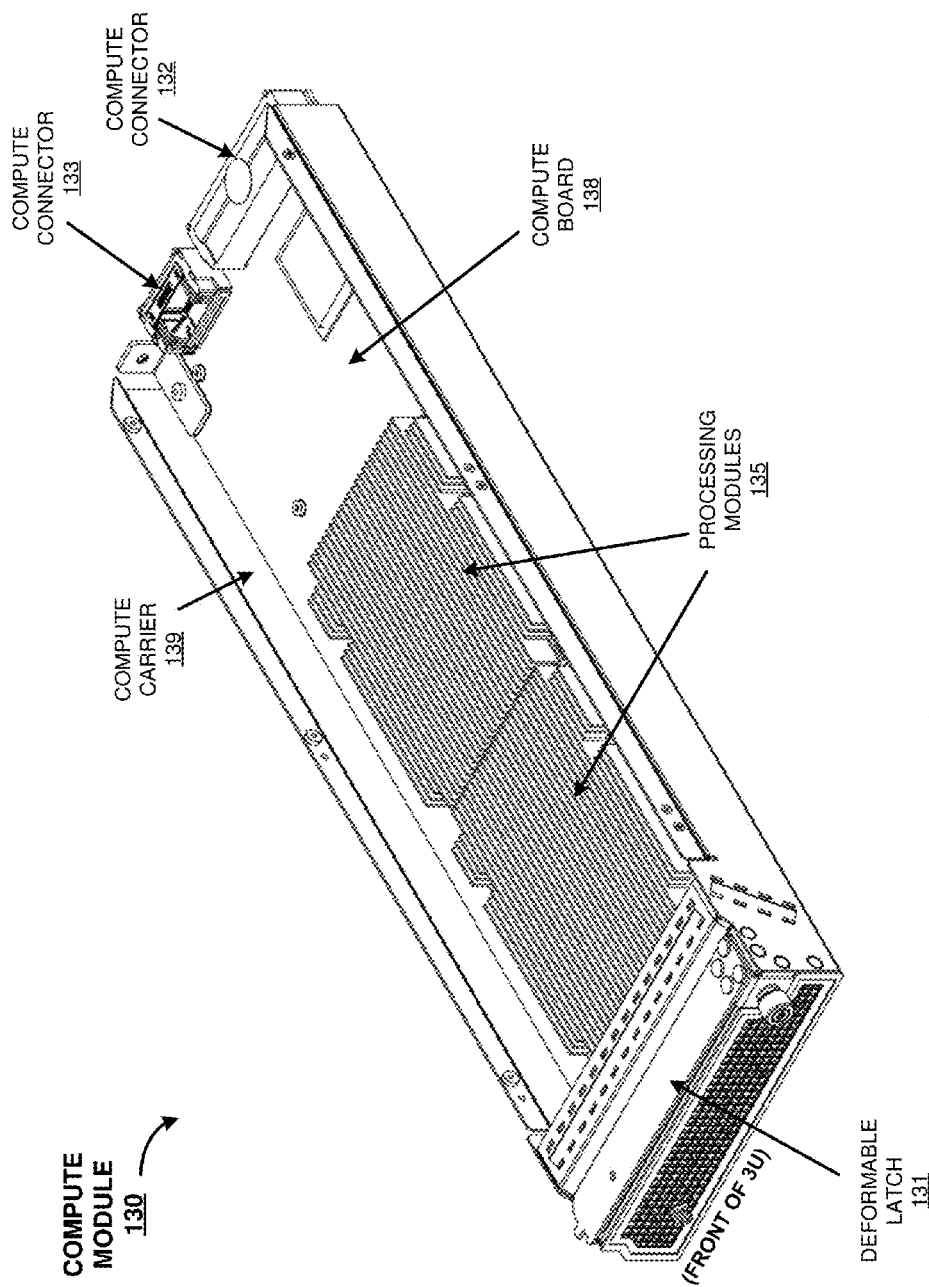
FIG. 12 is a diagram illustrating a compute module assembly.

FIG. 12 illustrates compute module 130 with an associated cover removed. As seen in FIG. 12, compute module 130 includes two processing modules 135 and compute board 138. Processing modules 135 are coupled to compute board 138. In some examples, compute board 138 comprises a plurality of connectors or sockets into which each of processing modules 135 are inserted. In other examples, each of processing modules 135 are soldered onto board 138. Additionally, connectors 132-133 are coupled to board 138, along with any associated circuitry, such as PCIe switches, sideband interfaces, filters, power components, and the like.

Processing modules 135 each include a processing system comprising central processing units (CPUs), which can comprise Intel, AMD, or ARM CPUs, among other varieties with any number of processing cores employed per CPU. The processing systems can comprise system-on-a-board or system-on-a-chip assemblies which comprise one or more CPUs, RAM (such as DRAM), and interfacing elements (such as PCIe interfaces, network interfaces, or other communication interfaces). These two processing systems can be seen in FIG. 12, although a different number of processing systems per compute module is possible.

Figure 13:
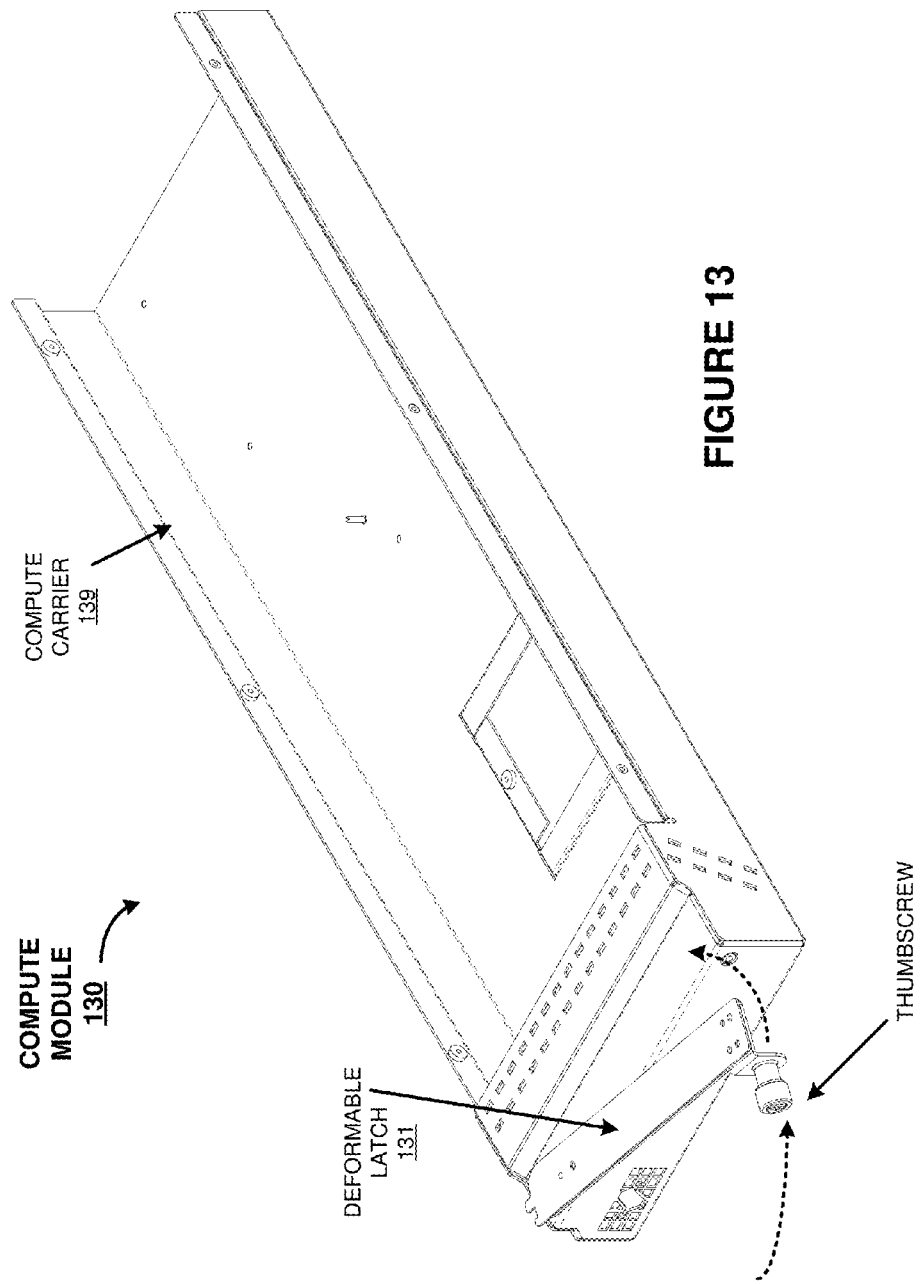
FIG. 13 is a diagram illustrating a compute module carrier.

FIG. 13 illustrates compute module 130 without compute board 138, connectors 132-133, and processing modules 135 to focus on compute carrier 139 insertion and removal features. Specifically, deformable latch 131 is illustrated in FIG. 13 as in an 'open' position. A user can move latch 131 inward toward compute carrier 139 after insertion of compute carrier 139 into an associate bay of storage assembly 100. An end of latch 131 opposite of the pictured thumbscrew feature is configured to engage a mating feature in the bay into which compute module 130 is inserted. Continued force onto the thumbscrew end of latch 131 will cam the opposite end of latch 131 into the mating feature of the bay and deform latch 131 to allow for a precision fit of connectors 132-133 into mating midplane connectors 194-195.

Figure 14:
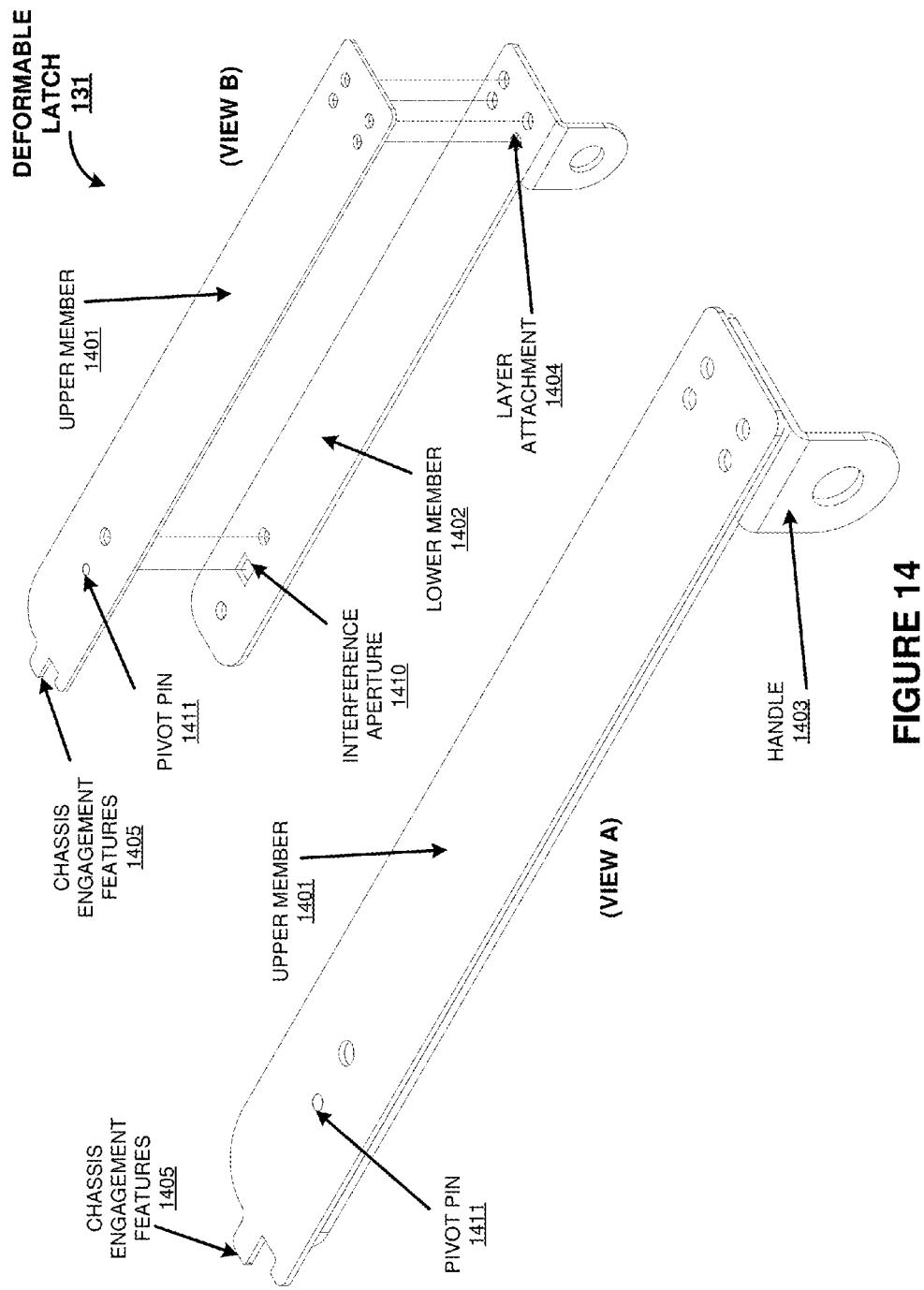
FIG. 14 is a diagram illustrating a latch assembly.

FIG. 14 illustrates deformable latch 131 in more detail, in two views, namely isometric view 'A' and isometric exploded view 'B'. To allow for easy and quick insertion and removal of compute module 130 from an associated bay, various quick-disconnect features such as latch 131 and an associated thumbscrew are employed. However, the associated connectors, namely compute module connectors 132-133 and midplane connectors 194-195, are each high pin density, small wipe, connectors. Thus, a precision fit is desired which does not over-stress the connectors or fail to properly seat the connectors into each other, and latch 131 allows for enhanced control of torque and force during insertion and removal of compute module 130. Similar features are employed on cross-connect module 150 detailed below, except module 150 employs two deformable latches instead of one.

In FIG. 14, view B shows a two-layer design, with a stacked configuration comprising upper member 1401 and lower member 1402. Upper member 1401 and lower member 1402 can comprise metallic elements, such as sheet metal, or other suitable materials. Upper member 1401 and lower member 1402 are each fixed or coupled together at layer attachment point 1404. This attachment point can comprise welds, rivets, or other low-profile coupling fasteners. Several attachment points can be employed as pictured to ensure redundancy and rigidity in the connection between layers at point 1404. Upper member 1401 and lower member 1402 are not joined or otherwise coupled at the end opposite attachment point 1404 (i.e. the end comprising chassis engagement features 1405), and are free to move in relation to each other at that end. However, due to the attachment at point 1404, the end comprising chassis engagement features 1405 does not move easily unless upper member 1401 and lower member 1402 deform with respect to each other. In this example, lower member 1402 is configured to deform in relation to upper member 1401 during insertion of the associated compute module into the at least one corresponding connector of midplane assembly 190, and lower member 1402 comprises a feature to interfere with a feature of upper member 1401 when the lower member 1402 has deformed a predetermined amount with respect to upper member 1401. It should be understood that either upper or lower members can deform, depending upon the vertical arrangement of deformable latch 131.

The entire latch 131 is coupled to carrier 139 of compute module 130 at pivot pin 1411. Pivot pin 1411 can comprise a screw, rivet, axle, or other shaft which is rotatably fastened into carrier 139 of compute module 130. Latch 131 can thus rotate about pivot pin 1411, or another pivot member, during insertion and removal of compute module 131. When latch 131 is fully engaged and compute module 130 fully inserted into associated midplane connectors, then a thumbscrew of latch 131 can be turned to further secure compute module 130 into the associated bay and prevent inadvertent movement of latch 131.

Turning now to the deformable operation of latch 131, as mentioned above, each layer of deformable latch 131 can move in relation to each other at one longitudinal end (1405) but are fixed together at another longitudinal end (1404). Chassis engagement features 1405 will engage an accompanying feature in a chassis or bay into which compute module 130 is inserted. Pivot pin 1411 extends through interference aperture 1410 and into carrier 139, and latch 131 rotates about pivot pin 1411. When a user pushes on handle 1403, latch 131 will rotate about pivot pin 1411 and chassis engagement features 1405 will "cam" into the mating features of the bay/assembly and associated connectors on the rear of compute module 130 will begin to engage mating connectors on a midplane assembly. Once enough force is applied to latch 131, each layer of latch 131 can move in relation to each other at the end of chassis engagement features 1405. Specifically, lower member 1402 will begin to deform "outward" from compute module 130 and upper member 1401 will remain fixed as it cams into the mating features of the bay or assembly. Interference aperture 1410 provides a physical window for lower member 1402 to deform before causing a wall of interference aperture 1410 hits pivot pin 1411. Thus, when enough force is applied to deform lower member 1402 of latch 131, the deformation causes pivot pin 1411 and interference aperture 1410 to interfere which halts movement of latch 131.

Interference aperture 1410 can be sized to provide a desired amount of deformation of lower member 1402 and consequently provide a limit or maximum amount of force that can be applied to chassis engagement features 1405 when force is applied to handle 1403. A larger interference aperture 1410 will allow for more relative deformation between layers of latch 131, while a smaller interference aperture 1410 will allow for less relative deformation.

A force exerted on handle 1403 and consequently upon the associated connectors at the rear of compute module 130 can be controlled to a maximum amount using the sizing of interference aperture 1410 as well as the material properties of the layers of latch 131. For example, although a size of interference aperture 1410 can affect the amount of deformation/travel between each layer, the rigidity of each layer can also affect the force applied to rear connectors. A more rigid material, such as due to thickness of a metal employed in the layers of latch 131, can allow for a greater force onto the connectors. Likewise, a thinner metal employed in the layers of latch 131 can allow for lesser force onto the connectors. Thus, a desired force for inserting compute module 130 into connectors of a midplane can be achieved. This advantageously allows for controlled force using a lever action while preventing too much bending and consequent overpressure applied to rear connectors of compute module 130. In examples with high-density, small wipe connectors, latch 131 ensures repeatable and reliable mating. Removal of compute module 130 from the associated bay/assembly can occur in the reverse, where chassis engagement features 1405 can "cam out" of the associated mating features of the bay/assembly to decouple the associated rear connectors from the midplane.

FIG. 15 is a diagram illustrating storage assembly 100, with an isometric view of a "rear" side of storage assembly 100. An isometric "front" view of storage assembly 100 is shown in FIGS. 1, 2, and 4. Storage assembly 100 comprises a plurality of different modular elements which can be employed for input/output (I/O) of various digital data, interconnection with other storage assemblies of a cluster, and power supply to the various modules.

Storage assembly 100 includes at least one chassis element 110 which provides a structure for various modules to interconnect and for mounting into a rack or shelf system. Chassis element 110 also provides a structure for various enclosure elements, such as case elements 111-113. Each case element 111-113 in FIG. 1 forms an enclosure over the associated portion of assembly 100 and couples to fastening elements of chassis 110. Case element 111 covers the storage sleds and compute modules, case element 112 covers the midplane area and mid-mounted fans, and case element 113 covers the rear interconnect modules and power supplies. Rackmount bracket 114 is employed to secure assembly 100 into a rackmount assembly/shelf or rack environment. Various handles can be employed on each module to insert and remove the associated module, and various handles can be employed on chassis 110 to insert and remove assembly 100 from an associated rack.

In the rear side of storage assembly 100, bays are configured to hold various modules 140, 150, and 180. Modules 140, 150, and 180 couple electrically and mechanically to various connectors and associated mechanical features that comprise a midplane that is located generally in the center of storage assembly 100, and covered by case element 112. Rear bays of storage assembly 100 can house external interfaces modules 140, cross-connect modules 150, and power supplies 180. Each of the modular elements of storage assembly 100 couple electrically and mechanically to various connectors and associated mechanical features of the midplane.

External interfaces module 140 comprises one or more communication interfaces via external connectors 141 for communicatively coupling modules of storage assembly 100 to other storage assemblies, network links, user interfaces, or other elements. For example, external interfaces module 140 can comprise a PCIe interface module that couples a PCIe fabric of storage assembly 100 to other storage systems or processing systems, such as other ones of storage assemblies 100. In PCIe examples, connectors 141 can comprise mini-SAS HD jacks over which PCIe signaling is carried when associated mini-SAS HD cables are employed. External interfaces module 140 communicatively couples the selected external interfaces to the midplane of assembly 100. External interfaces can include PCIe connections, Ethernet connections, FiberChannel connections, administrative console connections, sideband interfaces such as USB, RS-232, video interfaces such as video graphics array (VGA), high-density media interface (HDMI), digital video interface (DVI), among others, such as keyboard/mouse connections. In many examples, external interfaces module 140 allows for connection of storage assembly 100 to one or more networks for receipt and transfer of storage operations, such as with end users or other server/computing equipment. When Ethernet interfaces are employed, associated Ethernet jacks can support 40 Gigabit Ethernet (40 GbE), among other throughputs Cross-connect modules 150 each employ two deformable latches 151 which are each similar to deformable latch 131 employed for compute module 130. Deformable latches 151 each provide for precision insertion of connectors associated with cross-connect modules 150 into associated midplane connectors. As seen below for FIGS. 17-18, cross-connect modules 150 employ a tiered connection scheme which benefits from a precision and force-controlled insertion provided by deformable latches 151. Cross-connect modules 150, in addition to coupling front and rear boards of midplane assembly 190, also provide further external interfaces for storage assembly 100. As seen in FIG. 15, these interfaces comprise PCIe interfaces for cluster interconnect 153 provided over QSFP/QSFP+ jacks and Ethernet jacks for control plane network connections 152. The Ethernet jacks can support 10 Gigabit Ethernet (10 GbE), among other throughputs. Mini-SAS HD ports can be employed for cluster interconnect 153 that drive 12 Gb/s, which can support PCIe Gen 3 traffic.

Power supply modules 180 each comprise power electronics, power conditioning equipment and circuity, and various power conversion circuitry to convert line power introduced into a rear power port of each power supply into voltages/currents usable by storage assembly 100. Power supply modules 180 can be configured in a redundant arrangement, where failure of one or more of power supply modules 180 can be tolerated by use of one or more redundant power supply modules. In the midplane examples in FIGS. 17-18, large "bus" style connections are employed from the output of each power supply to voltage planes of each circuit board of midplane assembly 190. Control and status communication signals, as well as further power links, can also be employed between midplane 190 and power supplies 180, such as shown for power supply connector 199 in FIGS. 17-18.

Figure 16:
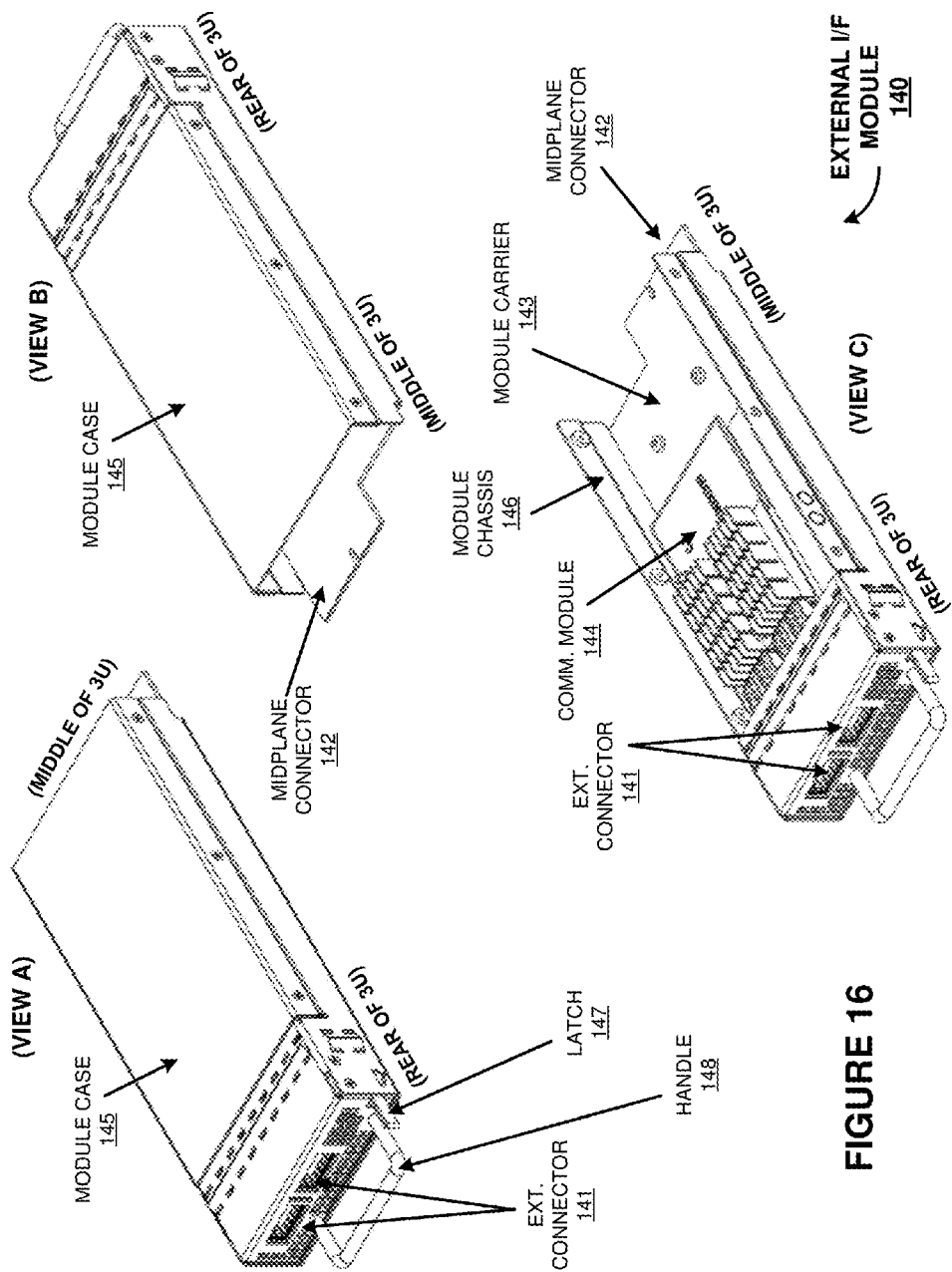
FIG. 16 is a diagram illustrating a communication module assembly.

FIG. 16 shows a further detailed views of external interfaces module 140. View 'A' shows an isometric front view of external interfaces module 140, view 'B' shows an isometric rear view of external interfaces module 140, and view 'C' shows an isometric front view with case 145 removed to show internal components of external interfaces module 140. External interfaces module 140 comprises external connector 141, midplane connector 142, communication module 144, module case 145, and module chassis 146. External interfaces module 140 can be inserted and removed from an associated bay using handle 148 and latch 147. Latch 147 snaps into a mating feature of an associated bay during insertion, to prevent inadvertent removal of external interfaces module 140 from the bay. Although a high-precision deformable latch (such as in compute module 130) can be employed, in this example a low-density midplane connector 142 is employed and thus a less precision latch 147 is employed to prevent inadvertent removal. Handle 148 can be pushed by a user to insert external interfaces module 140 into the associated bay and engage latch 147 into an associated mating feature of the bay.

Figure 20:
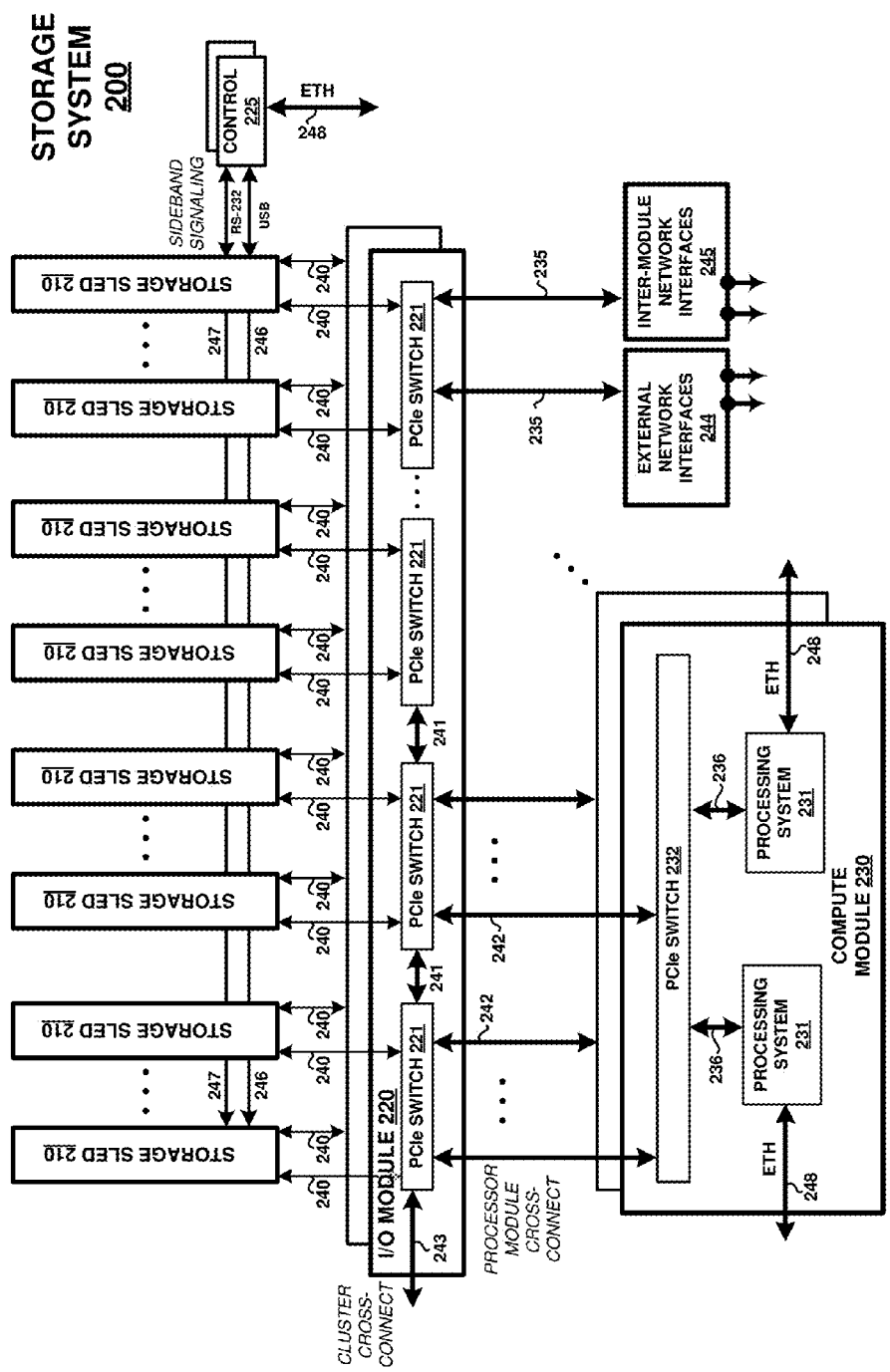
FIG. 20 is a system diagram illustrating a storage system.

External interfaces module 140 couples one or more external interfaces to a PCIe interface of midplane assembly 190, such as the PCIe fabric seen in FIG. 20. External connectors 141 can include one or more ports or jacks, such as mini-SAS HD, QSFP/QSFP+, Ethernet, video, graphics, USB, serial, or other ports or jacks. In FIG. 16, communication module 144 comprises interface circuitry to interwork between midplane communications provided over midplane connector 142 and external connectors 141. Mini-SAS HD ports can be employed for external connectors 141 that drive 12 Gb/s, which can support PCIe Gen 3 traffic.

For example, communication module 144 can comprise a PCIe peripheral card which is inserted into a right-angle PCIe slot or connector provided by a circuit board of module carrier 142. The PCIe card can comprise a HHHL card in some examples, although other heights and lengths of PCIe cards can be employed. The PCIe card can comprise any PCIe card which fits into the form factor of external interfaces module 140, and thus a highly flexible communication interface can be achieved. Moreover, each of the external interfaces modules 140 employed in assembly 100 can employ different communication interfaces, allowing for a plurality of communication interfaces to be communicatively coupled to midplane 190 using a common or similar external interfaces module 140. In some examples, the PCIe card Communication module 144 can comprise a PCIe card with a network adapter, network interface card (NIC), PCIe switch for PCIe interfaces, FiberChannel adapter, Ethernet adapter, graphics adapter, video processing circuitry, or other PCIe cards. Custom form-factor communication modules 144 can instead be employed. In some examples, communication module 144 can be incorporated into a circuit board of module carrier 143. Further interconnect, such as cables, wires, interface boards, and the like, can be employed between communication module 144 and external connectors 141.

Turning now to midplane assembly 190 and cross-connection modules 150, FIG. 17-18 are presented. FIG. 17 presents midplane assembly 190 and cross-connection modules 150 with a "front" side isometric view. FIG. 18 presents midplane assembly 190 and cross-connection modules 150 with a "rear" side isometric view. Midplane assembly 190 provides for both front and rear bays in storage assembly 100, which advantageously allows for high-density arrangements of storage sleds, compute modules, interface modules, power supplies, fan modules, and other components. Midplane assembly 190 also provides for mid-mounted fans in storage assembly 100, leading to more efficient cooling of storage assembly 100 and less restricted airflow throughout.

Midplane assembly 190 comprises two circuit boards in this example, front midplane board 191 and rear midplane board 192. Each of front midplane board 191 and rear midplane board 192 are coupled to chassis 110 of storage assembly 100 by one or more screws, rivets, or other fasteners. Midplane assembly 190 includes a volume of space between front midplane board 191 and rear midplane board 192 into which one or more fan modules 170 are inserted. Fan modules 170 (shown in detail in FIG. 19) provide for airflow in storage assembly 100 to cool the various front and rear modules therein. FIG. 2 illustrates five fan modules installed in the volume provided by the two midplane boards. Various airflow apertures 1701 are provided in front midplane board 191 and rear midplane board 192 to allow for airflow through midplane assembly 190 and into modules in the front and rear of storage assembly 100.

Front midplane board 191 comprises a front side and a rear side. The front side of front midplane board 191 comprises one or more connectors and alignment features for coupling to front side modules, such as storage sled octets 120 and compute modules 130. Pairs of front-side connectors 194-195 are employed for each bay/module. A plurality of airflow apertures are provided on front midplane board 191 to provide for airflow through associated front side modules. This front-side module connector configuration allows for high-density, short wipe connectors (and cooling apertures) to be in a compact and efficient form factor. FIG. 18 illustrates the back side of front midplane board 191, which includes primary cross-connectors 196 which couple to associated connectors on cross-connector modules 150. Front midplane board 191 also includes one or more power bus connections 193 for connecting high-current power links to associated power supply modules 180. Front midplane board 191 can also comprise various circuit links, traces, and other interconnect which communicatively couple ones of the front bay connectors 194-195 with connectors 196 on the back side of front midplane board 191. In further examples, front midplane board 191 can include one or more holdup components for storing power for use during power-loss events of storage assembly 100, such as capacitor arrays.

Rear midplane board 192 comprises a front side and a rear side. The rear side of rear midplane board 192 comprises one or more connectors and alignment features for coupling to rear side modules, such as external interfaces modules 140 and power supply modules 180. A plurality of airflow apertures are provided on front midplane board 192 to provide for airflow through associated rear side modules. Connectors 198 couple to external interfaces modules 140 and connectors 199 couple to power supply modules 180. Secondary cross-connectors 197 couple to associated connectors on cross-connector modules 150. FIG. 18 shows a better view of the rear side connectors of rear midplane board 192. Rear midplane board 192 also includes one or more connectors for providing control and power signaling to fan modules 170. Rear midplane board 192 also includes one or more power bus connections 193 for connecting high-current power links to associated power supply modules 180. Rear midplane board 192 can also comprise various circuit links, traces, and other interconnect which communicatively couple ones of connectors 196-199. In further examples, rear midplane board 192 can include one or more holdup components for storing power for use during power-loss events of storage assembly 100, such as capacitor arrays.

FIGS. 17 and 18 also illustrate two cross-connect modules 150, which are removable from the midplane assembly much like any of the other modules discussed herein. In FIG. 15, each cross-connect module 150 is shown having two deformable latches 151, to enable precision high-force insertion of short wipe connectors associated with insertion of cross-connect module 150 into midplane assembly 190 within an associated bay. Cross-connect module 150 has an associated "two-tier" connector configuration, formed by primary cross-connector 197 and secondary cross-connector 196. Cross-connect module 150 comprises a circuit board coupled to two sets of connectors, a first set configured to couple to primary cross-connectors 196, and a second set configured to couple to secondary cross-connectors 197. Cross-connect module 150 thus communicatively couples signaling of front midplane board 191 to signaling of rear midplane board 192. Cross-connect module 150 can include one or more PCIe switch circuits which form a PCIe fabric among the various modules of storage assembly 100.

Advantageously, cross-connect module 150 mechanically and communicatively couples two midplane circuit boards together at different "stackups" along cross-connect module 150 for each set of connectors 196-197. This arrangement enables high signal integrity connections between separate midplane boards as well as providing space for fan modules in-between the midplane boards for enhanced cooling and ventilation. Manufacturing costs are significantly lower for the dual-midplane/cross-connect module 150 arrangement than for other configurations such as a single midplane board that can receive both front and rear modules but lacks center-mounted fan modules. Manufacturing costs are significantly lower than a flexible or "flex" circuit board arrangement. Moreover, dual-midplane/cross-connect module 150 allows better ventilation throughout the entire storage assembly 100 than traditional backplane arrangements, due in part to the mid-mounted fan modules which allow for less airflow resistance. For example, only approximately ½ of the storage assembly 100 much have airflow "pulled" through and approximately ½ of the storage assembly 100 must have airflow "pushed" through, in contrast to a backplane arrangement where the entire length of an assembly must have the airflow pushed or pulled through.

Figure 19:
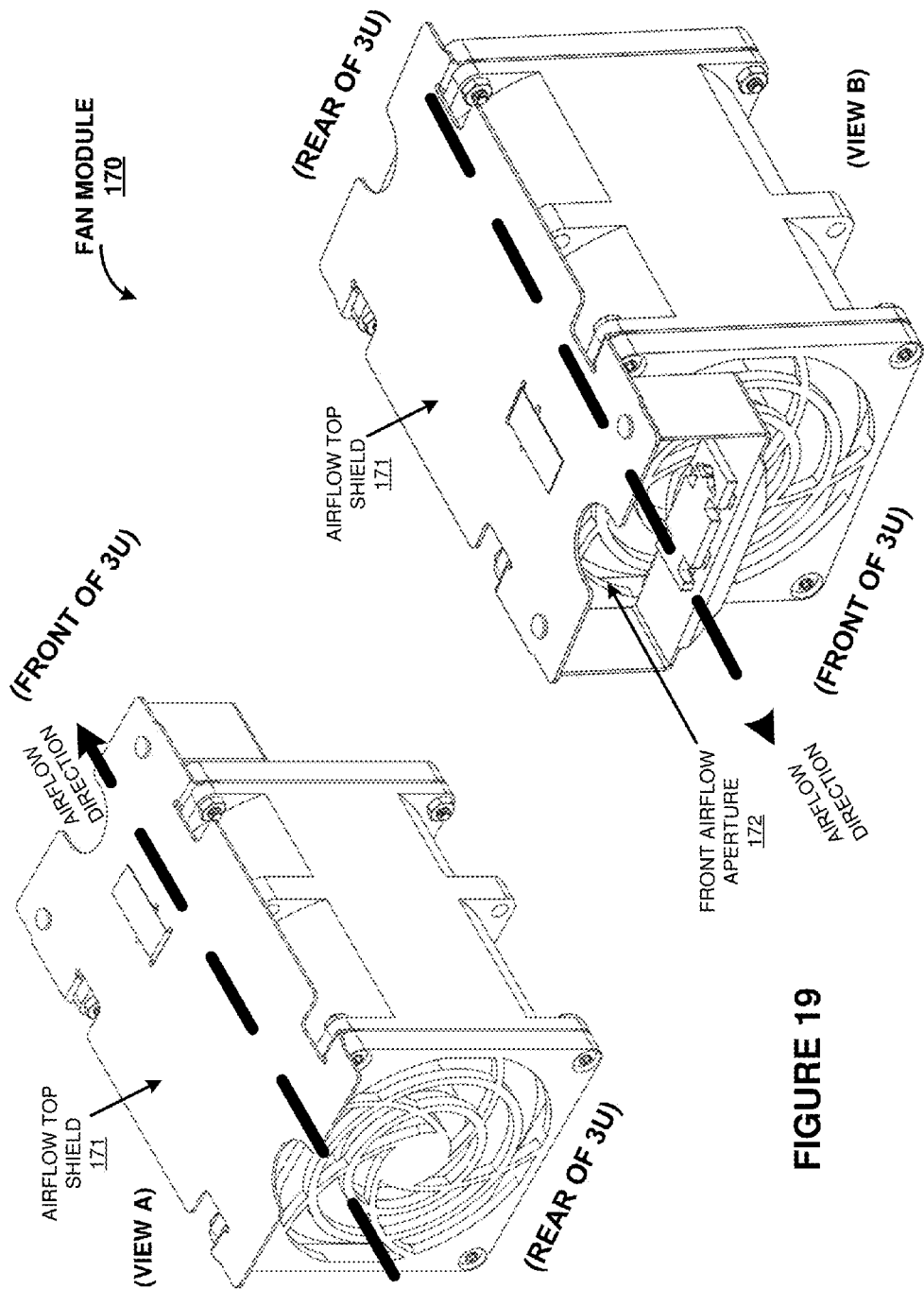
FIG. 19 is a diagram illustrating a fan assembly.

FIG. 19 shows fan module 170 in two views. A first view 'A' shows a rear-facing isometric view of fan module 170, while a second view 'B' shows a front-facing isometric view of fan module 170. Each fan module 170 can be installed into an associated location formed by the dual-midplane arrangement of storage assembly 100. Specifically, fan modules 170 are inserted into the volume between front midplane board 191 and rear midplane board 192. Fan module 170 includes one or more sub-chassis for structural support, and electrical interconnect for power and control signaling. The arrow on fan 170 in FIG. 19 shows an example airflow direction of fan 170.

Fan module 170 also include airflow directional elements, namely airflow top shield 171 and front flow aperture 172, among other features. These airflow directional elements ensure airflow associated with the fan module 170 is directed into corresponding apertures in midplane boards 191-192 to all flow over and through the various front and rear modules in storage assembly 100. Each of the front and rear modules in storage assembly 100 includes external panels which allow for airflow, such as screens, mesh, EMI cages, perforations, and the like. In some examples, each fan module 170 comprises a double-stator fan. Fan modules 170 can comprise any fan type, such as axial-flow, centrifugal and cross-flow, or other fan types, including associated ducts, louvers, fins, or other directional elements, including combinations and variations thereof.

FIG. 20 is a system diagram illustrating storage system 200. Storage system 200 comprises an example electrical schematic view of the various modules of the previous figures. Storage system 200 includes several different module types in FIG. 20, namely storage sleds 210, input/output (I/O) modules 220, control module 225, and compute modules 230. In this example, many storage sleds, at least two I/O modules, at least two control modules, and at least two compute modules are included. However, it should be understood that any number of storage sleds 210, I/O modules 220, control modules 225, and compute modules 230 can be included, such as 72 storage sleds, 2 I/O modules, 2 control modules, and 8 compute modules. Additionally, power supply modules, fans, and associated power and control distribution links can also be included, but are omitted in FIG. 20 for clarity. Interposer equipment of storage sled octets are omitted in FIG. 20 for clarity to emphasize communication relationships.

As discussed in the examples above, a module or sled typically comprises physical support structure and enclosure that includes circuitry, printed circuit boards, semiconductor systems, and structural elements. The modules are insertable and removable from a rackmount style of enclosure. In some examples, the elements of FIG. 20 are included in a 3U chassis for mounting in a larger rackmount environment. It should be understood that the elements of FIG. 20 can be included in any physical mounting environment, and need not include any associated enclosures or rackmount elements.

A plurality of storage sleds 210 are included in system 200. Each storage sled 210 includes one or more storage drives, such as four in some examples. Each storage sled 210 also includes Peripheral Component Interconnect Express (PCIe) switches, processors, and control system elements. PCIe switches of each storage sled 210 communicate with one or more on-sled storage drives over associated PCIe links. PCIe switches of each storage sled 210 also are communicatively coupled to an on-sled processor or control system for traffic statistics retrieval and status monitoring, among other operations. PCIe switches of each storage sled 210 communicate over one or more PCIe links 240 with an associated PCIe switch 221 of an I/O module 220. Ones of sleds 210 can be grouped into group assemblies (such as octets) for ease of removal and insertion, and can couple to interposer boards which further couple to midplane assemblies.

PCIe switches 221 of I/O modules 220 form a PCIe fabric which is used for the transfer of storage operations and control instructions between storage sleds, compute modules, and network interfaces. Each PCIe switch 221 is cross-connected with one or more PCIe switch 221 over PCIe fabric links 241. Each PCIe switch 221 of I/O modules 220 communicate over associated PCIe links 242 with associated PCIe switch 232 of one or more compute modules 230. PCIe switch 232 communicates with one or more associated processing systems 231. I/O modules 220 also each use PCIe switches 221 for interconnecting processor modules, such as processor modules 230. PCIe switches 221 are employed for this processor module cross-connect, and communicate with ones of PCIe switches 221 in associated compute modules 230 over processor module cross-connect links 242. PCIe switch 232 communicates with ones of processing systems 231 over PCIe links 236. PCIe switches 221 can also each include 3U cross-connect links 243, which are used to expand the PCIe fabric to other physical 3U enclosures.

In the example in FIG. 20, PCIe switches 221 and 232 (and associated PCIe links) include a back end data plane of system 200 used for carrying user data between storage sleds 210 and compute modules 230. PCIe switches 221 and 232 (and associated PCIe links) also include a front end data plane of system 200 used for carrying user data and signaling between compute modules and externally-facing network interfaces.

Control module 225 includes one or more microprocessors or microcontrollers along with any associated storage memory. Control module 225 communicates with compute modules over Ethernet control plane links 248. Control module 225 communicates with data storage sleds over sideband links 246 and 247 which can comprise Universal Serial Bus (USB) links or universal asynchronous receiver/transmitter (UART) serial links (such as RS-232 links), among others.

Control module 225 initializes data storage sleds 210. Control module 225 also accumulates statistical data and usage information for each storage sled 210 in storage system 200. Control module 225 can retrieve this statistical data or usage information over Ethernet links 248 from compute modules 230 or over USB sideband and UART sideband links 246 from data storage sleds 210. Although one Ethernet link 248 is shown in FIG. 20, this link represents many links which individually couple to each processing system in each compute module of assembly 200. Ethernet links 248 comprise a control plane, which can be used for transferring control information and status information between compute modules. I/O module 220 also provides expansion of the control plane to other 3U enclosures for cluster control plane interconnect over Ethernet links.

Each compute module 230 communicates over one or more PCIe links 236 through PCIe switch 232 with external expansion cards or external PCIe ports. In some examples, the external network expansion cards include network interface cards for communicating over TCP/IP (Transmission Control Protocol (TCP)/Internet Protocol) networks or for carrying iSCSI (Internet Small Computer System Interface) or NVMe (Non-Volatile Memory Host Controller Interface Specification Express) traffic. These external network links are illustrated by external network interfaces 244. External access to storage system 200 is provided over ones of packet network links provided by external network interfaces 244, such as for end user access to data stored on storage sleds 210.

Each compute module 230 can also communicate with other compute modules, such as those in other storage assemblies, over one or more inter-module packet network interfaces 245. In some examples, module packet network interfaces 245 include network interface cards for communicating over Ethernet or TCP/IP networks for exchanging storage packets between compute modules.

The PCIe switches discussed herein can comprise PCIe crosspoint switches, which logically interconnect various ones of the associated PCIe links based at least on the traffic carried by each PCIe link. In some examples, logical segregation of the PCIe fabric is achieved using non-transparent ports of the PCIe switches. Each PCIe switch port can be a non-transparent (NT) or transparent port. An NT port can allow some logical isolation between endpoints, much like a bridge, while a transparent port does not allow logical isolation, and has the effect of connecting endpoints in a purely switched configuration. Access over an NT port or ports can include additional handshaking between the PCIe switch and the initiating endpoint to select a particular NT port or to allow visibility through the NT port.

In other examples, logical segregation of the PCIe fabric is achieved using domain-based routing of the PCIe switches. A domain-based PCIe signaling distribution can be included in the PCIe switches which allows segregation of PCIe ports of a PCIe switch according to user-defined groups. These logical segregation or groups can be used to form the front-end and back-end data planes discussed herein, or can be used for establishing routing and redundancy among the various PCIe switches, forming a mesh fabric of PCIe traffic in system 200.

PCIe can support multiple bus widths, such as ×1, ×4, ×8, ×16, and ×32, with each multiple of bus width comprising an additional "lane" for data transfer. PCIe also supports transfer of sideband signaling, such as System Management Bus (SMBus) interfaces and Joint Test Action Group (JTAG) interfaces, as well as associated clocks, power, and bootstrapping, among other signaling. Although PCIe is used in FIG. 20, it should be understood that different communication links or busses can instead be employed, such as NVMe, Ethernet, Serial Attached SCSI (SAS), FibreChannel, Thunderbolt, Serial Attached ATA Express (SATA Express), among other interconnect, network, and link interfaces. Any of the links in FIG. 20 can each use various communication media, such as air, space, metal, optical fiber, or some other signal propagation path, including combinations thereof. Any of the links in FIG. 20 can include any number of PCIe links or lane configurations. Any of the links in FIG. 20 can each be a direct link or might include various equipment, intermediate components, systems, and networks. Any of the links in FIG. 20 can each be a common link, shared link, aggregated link, or may be comprised of discrete, separate links.

In FIG. 20, any processing system 231 on any compute module 230 has logical visibility to all storage drives 211 in all storage sleds 210 over the PCIe fabric. Any processing system 231 can transfer data for storage on any storage drive 211 and retrieve data already stored on any storage drive 211. Thus, 'm' number of storage drives can be coupled with 'n' number of processors to allow for a large, scalable architecture with a high-level of redundancy and density.

To provide visibility of each processing system 231 to any storage sled 210, various techniques can be employed. In a first example, a particular processing system 231 manages (instantiates/binds) a subset number of the total quantity of storage sleds, such as 16 storage drives spanning 4 storage sleds, and handles transactions for that subset of storage drives, such as read and write transactions. Each processing system 231, however, has memory-mapped or routing-table based visibility to the storage drives managed by any other processing system 231 or processing systems in other storage assemblies. When a storage operation is desired for a storage drive not managed by a particular processing system, the particular processing system uses the memory mapped access or routing-table based visibility to direct the storage operation to the proper storage drive for that transaction. The transaction can be transferred and transitioned to the appropriate processing system that manages that storage drive associated with the data of the transaction. The front end PCIe data plane, through PCIe switches 221, or inter-module network interfaces 245 are used to transfer data between processing systems so that a particular processing system or processor can store the data in the storage sled or sleds that is managed by that particular processing system, even though the data might be received over a network interface associated with a different processing system.

In operation, such as a write operation, data can be received over portions of external network interfaces 244 by any processing system 231 of any compute module 230. For example, the write operation can be a write operation received over external network interfaces 244 from an end user employing an iSCSI protocol or NVMe protocol. The processing system that receives the write operation determines if it physically manages the storage drive or drives associated with the write operation, and if it does, then the processing system transfers the data for storage on the associated storage drives over a back end data plane of the PCIe fabric. If the processing system determines that it does not physically manage the storage drive or drives associated with the write operation, then the processing system transfers the write operation to another compute module that includes the processing system that does manage the storage drive or drives over either the front end PCIe data plane or over inter-module network interfaces 245. Data striping can be employed by any processing system to stripe data for a particular write transaction over any number of storage drives, such as over all of the storage sleds that include storage drives managed by the particular processing system.

In this example, the PCIe interfaces associated with each processing system 231 have 64-bit address spaces, which allows an addressable space of $2^{64}$ bytes, leading to at least 16exbibytes of byte-addressable memory. The 64-bit PCIe address space can shared by all processing systems 231 for memory mapping to storage drives on storage sleds. Thus, while each particular processing system 231 actually manages a subset of the total storage drives on storage sleds, all processors 231 have visibility to, and can initiate read/write transactions to, any of storage drives on storage sleds. A managing processing system 231 that manages a particular storage drives on storage sleds receives write/read transactions and any associated data from an initiating processing system 231 by at least using a memory-mapped address space or routing table to establish which compute module handles storage operations for a particular set of storage sleds.

Figure 21:
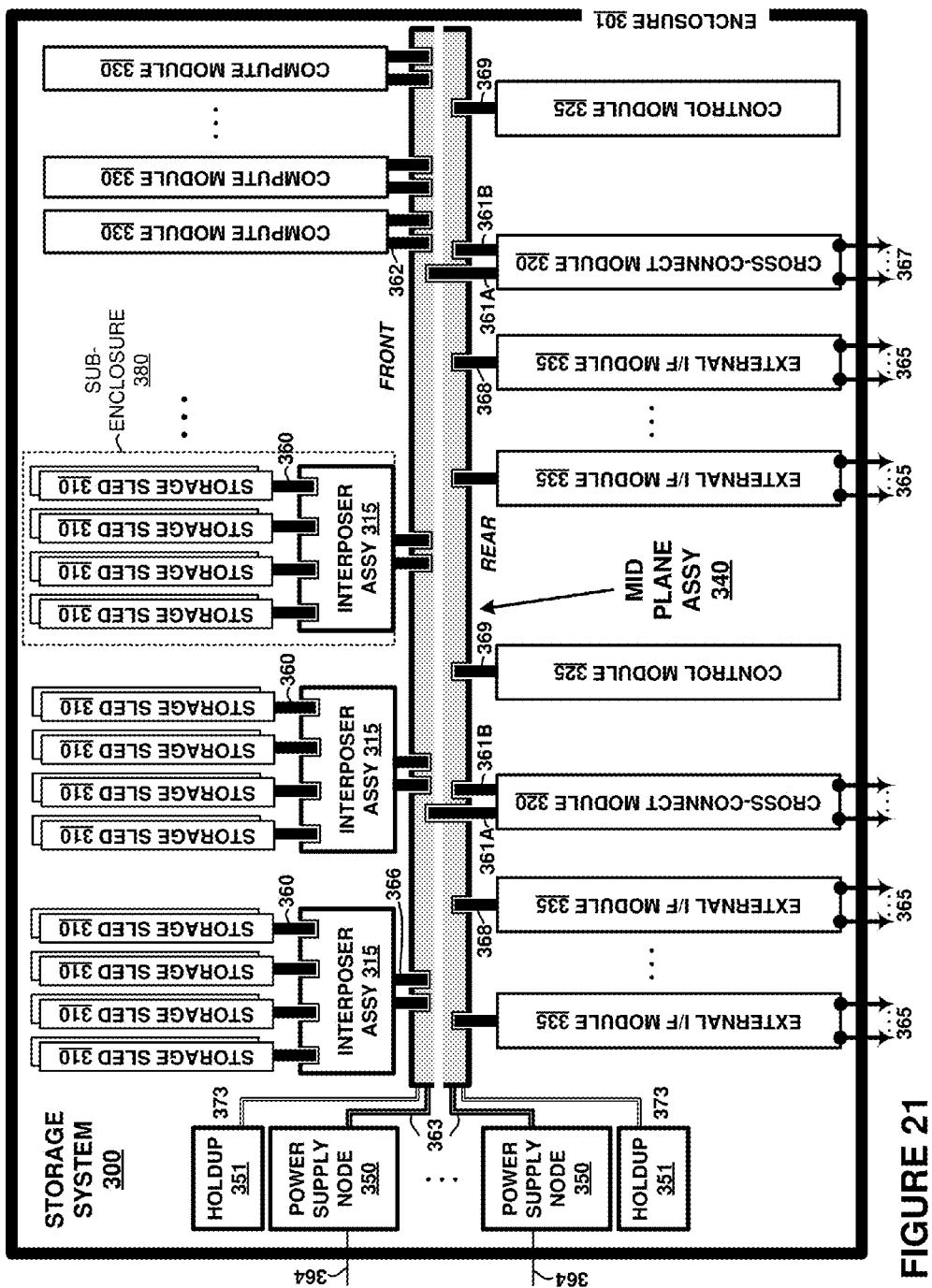
FIG. 21 is a block diagram illustrating a storage system.

FIG. 21 is a block diagram illustrating storage system 300. FIG. 21 is a block diagram illustrating the various modules of the previous figures as related to a midplane. The elements of FIG. 21 are shown as physically mated to midplane 340. Midplane 340 includes a at least two circuit board elements and a plurality of physical connectors for mating with any associated storage sleds 310, interposer assemblies 315, cross-connect modules 320, control modules 325, compute modules 330, external interfaces module 335, or power supply nodes 350. Midplane 340 comprises one or more printed circuit boards, connectors, physical support members, chassis elements, structural elements, and associated links as metallic traces or optical links for interconnecting the various elements of FIG. 21. Midplane 340 can function as a backplane, but instead of having sleds or modules mate on only one side as in single-sided backplane examples, midplane 340 has sleds or modules that mate on at least two sides, namely a front and rear. Elements of FIG. 21 can correspond to similar elements of FIGS. 2, 17, and 18, such as midplane assembly 190, although variations are possible.

FIG. 21 shows all elements included in a 3U enclosure 301. The enclosure can instead be of any multiple of a standardized computer rack height, such as 1U, 2U, 3U, 4U, 5U, 6U, 7U, and the like, and can include associated chassis, physical supports, cooling systems, mounting features, cases, and other enclosure elements. Typically, each sled or module will fit into associated slot or groove features included in a chassis portion of enclosure 301 to slide into a predetermined slot and guide a connector or connectors associated with each sled to mate with an associated connector or connectors on midplane 340. System 300 enables hot-swapping of any of the modules or sleds and can include other features such as power lights, activity indicators, external administration interfaces, and the like.

Storage sleds 310 each have an associated connector 360 which mates into a mating connector of an associated interposer assembly 315. Each interposer assembly 315 has associated connectors 366 which mate with one or more connectors on midplane 340. In this examples, up to eight storage sleds 310 can be inserted into a single interposer assembly 315 which subsequently mates to a plurality of connectors on midplane 340. These connectors can be a common or shared style/type which is used by compute modules 330 and connector 362. Additionally, each collection of storage sleds 310 and interposer assembly 315 can be included in a sub-assembly or sub-enclosure 380 which is insertable into midplane 340 in a modular fashion. Compute modules 330 each have an associated connector 362, which can be a similar type of connector as interposer assembly 315. In some examples, such as in the examples above, compute modules 330 each plug into more than one mating connector on midplane 340.

Control modules 325 each have an associated connector 369. In some examples, ones of control modules 325 and cross-connect modules 320 are included in the same module. Cross-connect modules 320 each have an associated two-tier connector 361, formed by connector 361A and 361B, as discussed in FIGS. 17-18. Cross-connect modules 320 also each have one or more cluster interconnect links 367, which in this example comprise PCIe links and Ethernet links. Cluster interconnect links 367 are employed to interconnect 3U enclosures between each other using PCIe links and Ethernet links, such as interconnecting compute modules 330 plugged into other midplanes of other assemblies. The PCIe links used for external interconnect can terminate at external connectors, such as mini-Serial Attached SCSI (mini-SAS) or mini-SAS HD jacks or connectors which are employed to carry PCIe signaling over mini-SAS cabling. In further examples, mini-SAS HD cables are employed that drive 12 Gb/s versus 6 Gb/s of standard SAS cables. 12 Gb/s can support PCIe Gen 3. Quad (4-channel) Small Form-factor Pluggable (QSFP or QSFP+) connectors or jacks can be employed as well for carrying PCIe signaling.

External interfaces module 335 each have an associated connector 368. External interfaces module 335 provide external access to the storage contents of system 300, such as for end user devices or external systems. Links 365 can comprise PCIe links or network links provided by external interfaces module 335, which can comprises Ethernet, TCP/IP, Infiniband, iSCSI, or other external interfaces. In operation, external interfaces module 335 each is communicatively coupled with an associated compute module, such as pictured in FIG. 20. Links 365 can comprise links for communicating with external systems, such as management systems, end user devices, or other computing systems, including other enclosures similar to system 300. External links 365 can comprise PCIe links, Ethernet, SFP+, or other links and connectors. The PCIe links used for external interconnect can terminate at external connectors, such as mini-SAS or mini-SAS HD jacks or connectors which are employed to carry PCIe signaling over mini-SAS cabling. In further examples, mini-SAS HD cables are employed that drive 12 Gb/s versus 6 Gb/s of standard SAS cables. 12 Gb/s can support PCIe Gen 3. Quad (4-channel) Small Form-factor Pluggable (QSFP or QSFP+) connectors or jacks can be employed as well for carrying PCIe signaling.

In some examples, system 300 includes case or enclosure elements, chassis, and midplane assemblies that can accommodate a flexible configuration and arrangement of sleds and associated circuit cards. Although FIG. 21 illustrates storage sleds mating and compute modules on a first side of midplane assembly 340 and various modules mating on a second side of midplane assembly 340, it should be understood that other configurations are possible. System 300 can include a chassis to accommodate any of the following configurations, either in front-loaded or rear-loaded configurations:

storage modules that contain multiple SSDs each modules containing HHHL cards (half-height half-length PCIe cards) or FHHL cards (full-height half-length PCIe cards), that can comprise graphics cards or graphics processing units (GPUs), PCIe storage cards, PCIe network adaptors, or host bus adaptors modules with PCIe cards (full-height full-length PCIe cards) that comprise compute modules, which can comprise NVIDIA Tesla or Intel Phi processor cards modules containing 2.5-inch PCIe SSDs cross-connect modules, interposer modules, and control modules Additionally, power and associated power control signaling for the various sleds of system 300 is provided by one or more power supply nodes 350 over associated links 363, which can comprise one or more links of different voltage levels, such as +12 VDC or +5 VDC, among others. Although power supply nodes 350 are shown as included in system 300 in FIG. 21, it should be understood that power supply nodes 350 can instead be included in separate enclosures, such as separate 1U enclosures. Each power supply node 350 also includes power link 364 for receiving power from power sources, such as AC or DC input power.

Additionally, power holdup circuitry can be included in holdup modules 351 which can deliver holdup power over links 373 responsive to power loss in link 364 or from a failure of power supply nodes 350. Power holdup circuitry can also be included on each sled or module. This power holdup circuitry can be used to provide interim power to the associated sled or module during power interruptions, such as when main input or system power is lost from a power source. Additionally, during use of holdup power, processing portions of each sled or module can be employed to selectively power down portions of each sled according to usage statistics, among other considerations. This holdup circuitry can provide enough power to commit in-flight write data during power interruptions or power loss events. These power interruption and power loss events can include loss of power from a power source, or can include removal of a sled or module from an associated socket or connector on midplane 340. The holdup circuitry can include capacitor arrays, super-capacitors, ultra-capacitors, batteries, fuel cells, flywheels, or other energy storage components, along with any associated power control, conversion, regulation, and monitoring circuitry.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A data processing assembly, comprising: a midplane assembly comprising at least two circuit boards and configured to: electrically couple via a first circuit board on a first side of the midplane assembly to a plurality of storage modules; electrically couple via the first circuit board on the first side of the midplane assembly to a plurality of graphics processing modules; electrically couple via the first circuit board on the first side of the midplane assembly to a plurality of compute modules; electrically couple via a second circuit board on a second side of the midplane assembly opposite the first side to a plurality of communication modules, wherein first ones of the plurality of communication modules comprise external communication interfacing modules and second ones of the plurality of communication modules comprise cross-coupling modules which span between the first circuit board and the second circuit board; electrically interconnect ones of the plurality of storage modules, the plurality of compute modules, the plurality of graphics processing modules, and the plurality of communication modules; receive power from one or more power supply modules and distribute the power to the plurality of storage modules, the plurality of compute modules, the plurality of graphics processing modules, and the plurality of communication modules; one or more fan modules mounted between the first circuit board and the second circuit board, the one or more fan modules configured to: provide airflow to the data processing assembly through at least a plurality of apertures in the first circuit board and the second circuit board; and a chassis configured to: mechanically house and structurally support each of the plurality of storage modules, the plurality of compute modules, the plurality of graphics processing modules, the plurality of communication modules, and the one or more power supply modules when coupled to the midplane assembly to form the data processing assembly and allow installation of the data processing assembly into a rackmount environment.

2. The data processing assembly of claim 1, further comprising: the one or more fan modules mounted between a front side of modules formed by at least the plurality of storage modules and the plurality of compute modules, and a rear side of modules formed by the plurality of communication modules and the one or more power supply modules, the one or more fan modules configured to provide airflow to the data processing assembly.

3. The data processing assembly of claim 1, comprising: one or more of the communication modules configured to span between both the first circuit board and the second circuit board and electrical couple the first circuit board and the second circuit board.

4. The data processing assembly of claim 1, comprising: the plurality of storage modules comprising storage sleds arranged into at least one octet, the octet comprising a carrier that houses and structurally supports up to eight removable ones of the storage sleds and the octet configured to be insertable into a front-side bay type of the data processing assembly.

5. The data processing assembly of claim 4, comprising: the plurality of compute modules and the plurality of graphics processing modules each configured to be interchangeable with the at least one octet into the front side bay type of the data processing assembly.

6. The data processing assembly of claim 4, comprising: the octet coupled to an interposer board which communicatively couples each of the eight removable ones of the storage sleds of the octet to the midplane assembly.

7. The data processing assembly of claim 1, comprising: the plurality of compute modules each comprising a deformable latch mechanism to provide insertion force for an associated compute module into at least one corresponding connector on the midplane assembly for an associated bay of the data processing assembly.

8. The data processing assembly of claim 7, comprising: the deformable latch mechanism comprising a two-layer configuration with an upper member and a lower member, the lower member configured to deform in relation to the upper member during insertion of the associated compute module into the at least one corresponding connector, and the lower member comprising a first feature to interfere with a second feature of the upper member when the lower member has deformed a predetermined amount with respect to the upper member.

9. The data processing assembly of claim 1, comprising: when in a compute-centric configuration, the data processing assembly configured to house a greater number of the plurality of compute modules and the plurality of graphics processing modules into front bays of the data processing assembly than the plurality of storage modules; and
when in a storage-centric configuration, the data processing assembly configured to house a greater number of the plurality of storage modules into the front bays than the plurality of compute modules and the plurality of graphics processing modules;
wherein the front bays comprise universal bays that can house any of the plurality of compute modules, the plurality of graphics processing modules, and the plurality of storage modules.

10. The data processing assembly of claim 1, comprising: the plurality of graphics processing modules each comprising at least one graphics processing unit (GPU).

11. A modular data processing assembly, comprising: a plurality of front-side modules insertable into associated front-side bays of the modular data processing assembly that, when inserted, couple by associated electrical connectors to a front portion of a midplane assembly; a plurality of rear-side modules insertable into associated rear-side bays of the modular data processing assembly that, when inserted, couple by associated electrical connectors to a rear portion of the midplane assembly, wherein first ones of the plurality of rear-side modules comprise external communication interfacing modules and second ones of the plurality of rear-side modules comprise cross-coupling modules configured to span between and electrically couple using associated connectors both the front portion of the midplane assembly and the rear portion of the midplane assembly; and the front portion of the midplane assembly and the rear portion of the midplane assembly configured to provide volume for one or more fan modules inserted into the volume between the front portion of the midplane assembly and the rear portion of the midplane assembly.

12. The modular data processing assembly of claim 11, comprising:
ones of the plurality of front-side modules and ones of the plurality of rear-side modules each comprising at least one deformable latch mechanism to provide insertion force for an associated module into at least one corresponding connector on the midplane assembly for an associated bay of the modular data processing assembly;

wherein the deformable latch mechanism comprises a two-layer configuration with an upper member and a lower member, the lower member configured to deform in relation to the upper member during insertion of the associated compute module into the at least one corresponding connector, and the lower member comprising a first feature to interfere with a second feature of the upper member when the lower member has deformed a predetermined amount with respect to the upper member.

13. The modular data processing assembly of claim 11, wherein at least one of the plurality of front-side modules comprises at least one graphics processing unit (GPU).

14. A method of operating a modular data processing assembly, the method comprising:

housing in the modular data processing assembly one or more compute modules, one or more data storage octet modules, and one or more graphics processing modules into front bays of the modular data processing assembly;

housing in the modular data processing assembly one or more communication modules into rear bays of the modular data processing assembly;

coupling electrical signaling associated with both the front bays through a front circuit board of a midplane assembly;

coupling electrical signaling associated with both the rear bays through a rear circuit board of the midplane assembly;

coupling electrical signaling between the front circuit board and the rear circuit board of the midplane assembly using one or more cross-connect modules inserted into the rear bays that span the front circuit board and the rear circuit board; and providing a volume between the front circuit board and the rear circuit board of the midplane assembly into which one or more fan modules can be inserted to provide airflow to the modular data processing assembly through a plurality of apertures in the front circuit board and the rear circuit board of the midplane assembly.

15. The method of claim 14, further comprising:

when in a compute-centric configuration, housing in the modular data processing assembly a greater number of compute modules and graphics processing modules into the front bays of the modular data processing assembly than data storage octet modules in the front bays; and when in a storage-centric configuration, housing in the modular data processing assembly a greater number of the data storage octet modules into the front bays than the compute modules and the graphics processing modules in the front bays.

16. The method of claim 14, wherein the one or more graphics processing modules each comprise at least one graphics processing unit (GPU).

* * * * *